(12) United States Patent
Bogaerts et al.

(10) Patent No.: US 12,173,581 B2
(45) Date of Patent: Dec. 24, 2024

(54) SYSTEM AND METHOD FOR PERFORMING A REAL-TIME INTEGRATED CEMENTING OPERATION

(71) Applicant: SCHLUMBERGER TECHNOLOGY CORPORATION, Sugar Land, TX (US)

(72) Inventors: Martinus Johannes Bernardus Bogaerts, Rosenberg, TX (US); Stephen Paul Bracken, Sugar Land, TX (US); Gioconda Tovar, Katy, TX (US); Jose Raul Contreras Escalante, Richmond, TX (US); Thilagawathy Nadaraja, Katy, TX (US); Pavel Nyaga, Houston, TX (US); Edward Smetak, Katy, TX (US); Andrew Whiddon, Houston, TX (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 882 days.

(21) Appl. No.: 16/063,356

(22) PCT Filed: Dec. 9, 2016

(86) PCT No.: PCT/US2016/065690
§ 371 (c)(1),
(2) Date: Jun. 18, 2018

(87) PCT Pub. No.: WO2017/106021
PCT Pub. Date: Jun. 22, 2017

(65) Prior Publication Data
US 2018/0363414 A1    Dec. 20, 2018

Related U.S. Application Data

(60) Provisional application No. 62/268,256, filed on Dec. 16, 2015, provisional application No. 62/268,170, filed on Dec. 16, 2015.

(51) Int. Cl.
*E21B 33/14* (2006.01)
*E21B 41/00* (2006.01)
(Continued)

(52) U.S. Cl.
CPC .............. *E21B 33/14* (2013.01); *E21B 41/00* (2013.01); *E21B 47/005* (2020.05); *E21B 47/06* (2013.01); *E21B 47/10* (2013.01); *G06F 30/20* (2020.01)

(58) Field of Classification Search
CPC ........ E21B 33/14; E21B 47/005; E21B 47/06; E21B 47/10; E21B 41/0092; E21B 41/00; G06F 30/20
See application file for complete search history.

(56) References Cited

U.S. PATENT DOCUMENTS

| 6,178,393 B1 | 1/2001 | Irvin |
| 6,994,167 B2 | 2/2006 | Ramos et al. |

(Continued)

FOREIGN PATENT DOCUMENTS

| WO | 2015077524 A1 | 5/2015 |
| WO | 2016069597 A1 | 5/2016 |

OTHER PUBLICATIONS

Gupta, N., et al. "Overcoming ultradeepwater cementing challenges in the Caribbean." SPE Latin America and Caribbean Petroleum Engineering Conference. Society of Petroleum Engineers, 2014. (Year: 2014).*

(Continued)

*Primary Examiner* — Boris Gorney
*Assistant Examiner* — David A Hopkins
(74) *Attorney, Agent, or Firm* — Jeffrey D. Frantz

(57) ABSTRACT

A method for performing an integrated cementing operation at a wellsite is disclosed. The method involves simulating a cementing operation including pumping sequences for
(Continued)

selectively pumping drilling fluid and cement into the wellbore according to pre-operation simulated pumping parameters, measuring real-time pumping parameters of the drilling fluid and the cement according to the pumping sequences, during the measuring, simulating real-time pumping parameters for each of the defined pumping sequences based on the measured real-time pumping parameters, and comparing the real-time simulated pumping parameters with the pre-operation simulated pumping parameters. The method may also involve measuring a return flow rate of fluid flowing out of the wellbore, defining a loss zone within the wellbore, simulating the return flow rate based on the input flow rate, and generating a rate of the fluid loss such that the simulated return flow rate equals the actual return flow rate.

19 Claims, 26 Drawing Sheets

(51) Int. Cl.
  *E21B 47/005* (2012.01)
  *E21B 47/06* (2012.01)
  *E21B 47/10* (2012.01)
  *G06F 30/20* (2020.01)

(56) References Cited

U.S. PATENT DOCUMENTS

| | | | |
|---|---|---|---|
| 7,464,757 | B2 | 12/2008 | Pessin et al. |
| 7,639,563 | B2 | 12/2009 | Wu et al. |
| 8,251,143 | B2 | 8/2012 | Drochon et al. |
| 8,800,656 | B2 | 8/2014 | Le Roy-Delage et al. |
| 2003/0046041 | A1* | 3/2003 | Copel .................... G05B 17/02 703/2 |
| 2004/0129456 | A1* | 7/2004 | Vail, III .................. E21B 23/00 175/57 |
| 2009/0194330 | A1 | 8/2009 | Gray |
| 2011/0127034 | A1 | 6/2011 | Vidick et al. |
| 2012/0043079 | A1* | 2/2012 | Wassouf ................. E21B 43/04 166/250.01 |
| 2013/0008647 | A1 | 1/2013 | Dirksen et al. |
| 2013/0118752 | A1* | 5/2013 | Hannegan ............. E21B 33/143 166/336 |
| 2014/0299377 | A1* | 10/2014 | Abbassian .............. E21B 44/00 175/40 |
| 2015/0066455 | A1* | 3/2015 | Madasu .................. G06F 30/23 703/2 |
| 2015/0186574 | A1* | 7/2015 | Huang .................... E21B 7/061 703/7 |
| 2015/0198009 | A1 | 7/2015 | Bexte et al. |
| 2015/0198032 | A1 | 7/2015 | Sinha et al. |
| 2015/0267504 | A1* | 9/2015 | Hannegan ............... E21B 33/14 166/345 |
| 2015/0315898 | A1* | 11/2015 | Marland ................. E21B 33/14 166/250.14 |
| 2015/0322775 | A1* | 11/2015 | Marland ................. E21B 47/06 702/12 |
| 2017/0183964 | A1* | 6/2017 | Jandhyala ................ G01V 1/40 |
| 2018/0328128 | A1* | 11/2018 | Ravi ....................... E21B 33/14 |

OTHER PUBLICATIONS

Ronaes, Egil, Truls Fossdal, and Tore Stock. "Real-time drilling fluid monitoring and analysis-adding to integrated drilling operations." SPE/IADC Drilling Conference and Exhibition. SPE, 2012. Abstract, introduction, figures 12-13 and their accompanying descriptions. (Year: 2012).*

Spoerker, H. F. "Real-Time Job Monitoring and Performance Control of Primary Cementing Operations as a Way to Total Quality Management." SPE Drilling & Completion 10.04 (1995): 233-237. Abstract and Introduction, fig. 2 and p. 234. (Year: 1995).*

Siddiqi, Faizan Ahmed, et al. "Successful managed pressure cementing with hydraulic simulations verification in a narrow pore-frac pressure window using managed pressure drilling in Saudi Arabia." SPE Annual Technical Conference and Exhibition 48 . SPE, 2016. Abstract, figures 1, 8-9 (Year: 2016).*

Piot, Bernard M., and Matteo Loizzo. "Reviving the job signature concept for better quality cement jobs." SPE/IADC Drilling Conference and Exhibition. SPE, 1998. Abstract and Introduction. (Year: 1998).*

Carter, Kyle M., Eric van Oort, and Andrew Barendrecht. "Improved regulatory oversight using real-time data monitoring technologies in the wake of Macondo." SPE Deepwater Drilling and Completions Conference. SPE, 2014. Abstract, figures 1, 6-7, and their accompanying descriptions. (Year: 2014).*

Islam, M. A., et al. "Automated pressure integrity testing APIT-A step change approach." Abu Dhabi International Petroleum Exhibition and Conference. SPE, 2016. Abstract, p. 7, figures 2, 4-8 and their accompanying descriptions. (Year: 2016).*

Israel, R., et al. "Well Advisor-Integrating Real-time Data With Predictive Tools, Processes and Expertise to Enable More Informed Operational Decisions." SPE/IADC Drilling Conference and Exhibition. SPE, 2015. Abstract, figures 1-2, 6-10 and their accompanying descriptions. (Year: 2015).*

Nayeem, Ayesha Arjumand, Ramachandran Venkatesan, and Faisal Khan. "Monitoring of down-hole parameters for early kick detection." Journal of Loss Prevention in the Process Industries 40 (2016): 43-54. Abstract, §§ 2.3.3, 2.3.8, 3.1. (Year: 2016).*

Stock, Tore, et al. "The development and successful application of an automated real-time drilling fluids measurement system." SPE Intelligent Energy International Conference and Exhibition. SPE, 2012. Abstract, fig. 12-13 and 15-17, along with the accompanying descriptions. (Year: 2012).*

International Search Report and Written Opinion issued in International Patent Application No. PCT/US2016/065690 on Apr. 25, 2017; 16 pages.

* cited by examiner

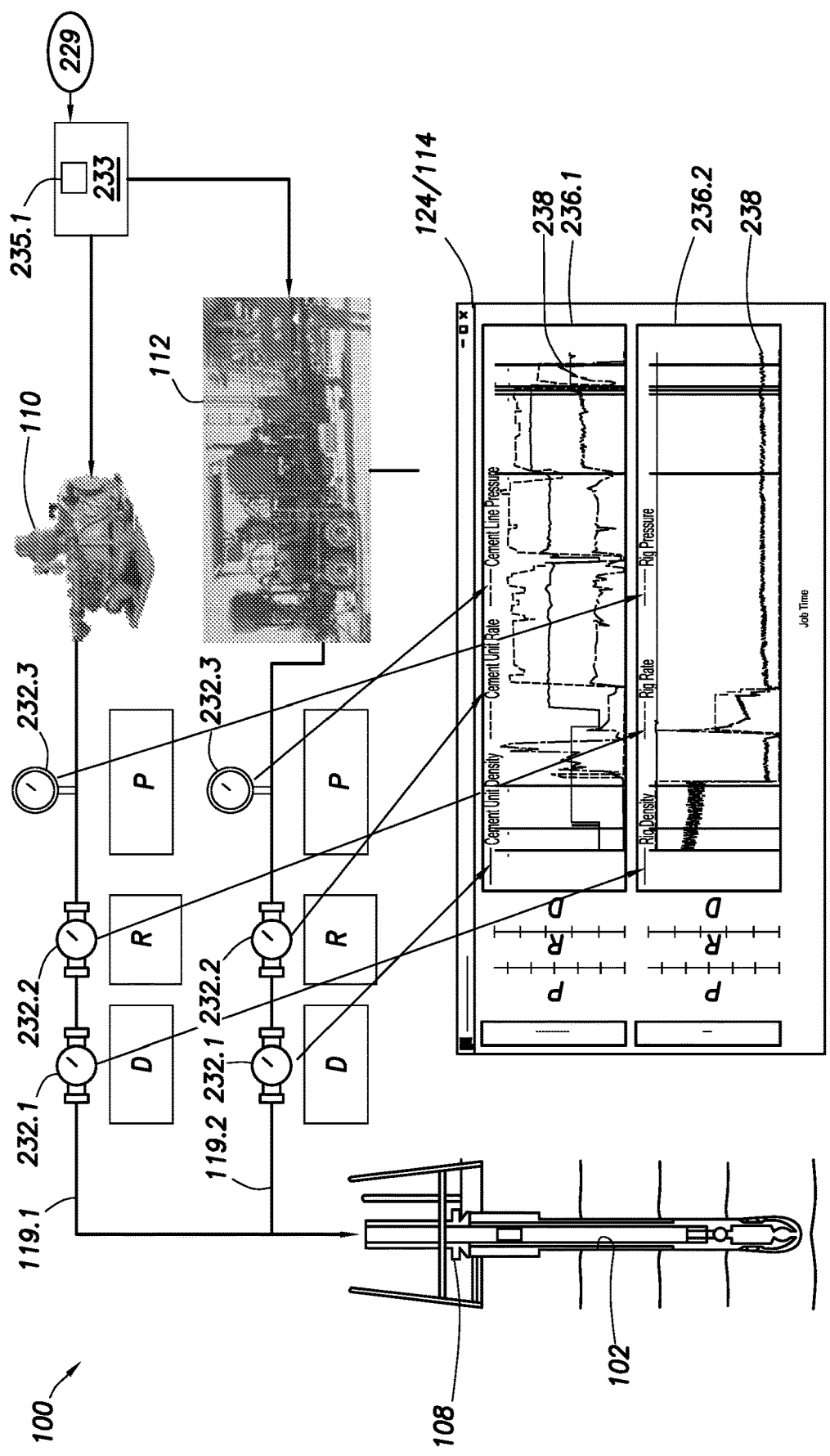
FIG.2.1

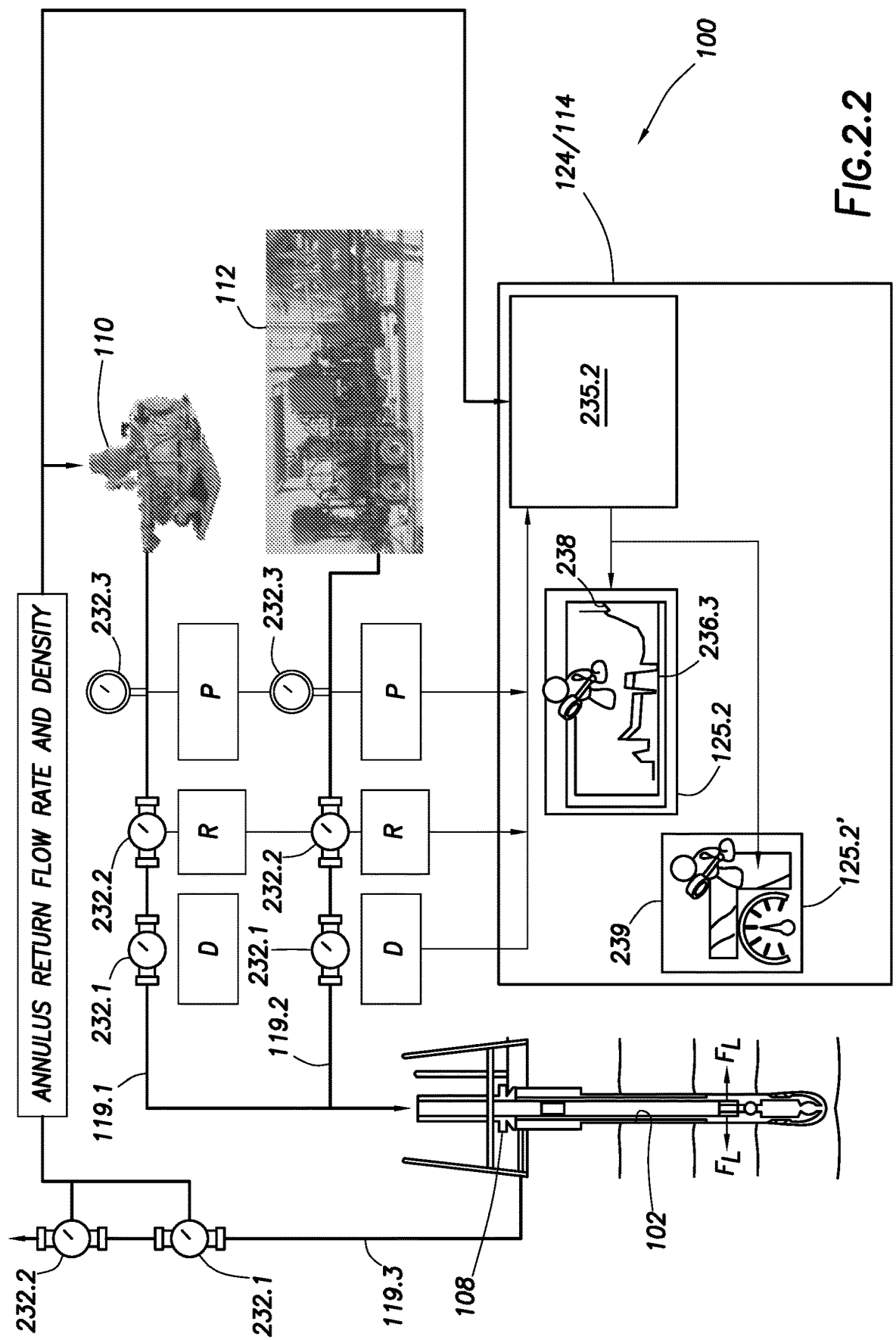
FIG.2.2

| Stage # | Stage Type | Fluid Name | Comment | Pumping Line | Planned Density lbm/gal | Density Override lbm/gal | Planned Rate bbl/min | Rate Override bbl/min | Back Pressure psi | Injection Temp degF | Planned Volume bbl | Actual Volume bbl | Start Time hr:mm:sc | Status |
|---|---|---|---|---|---|---|---|---|---|---|---|---|---|---|
| 1 | Normal | Spacer 3_1.3... | | Rig Line | 10.85 | ☐ | 6.3 | ☐ | 0 | 80 | 144.7 | 144.8 | 11/9/2015 10:52:30 | Completed |
| 2 | Pause | | | Cement Line | | | | | | | | | 11/9/2015 11:04:08 | Completed |
| 3 | Normal | Lead 1_1.45SG | | Cement Line | 12.10 | ☐ | 3.8 | ☐ | 0 | 80 | 467.8 | 467.8 | 11/9/2015 11:27:45 | Completed |
| 4 | Normal | Tail 7_1.8SG | | Cement Line | 15.02 | ☐ | 3.8 | ☐ | 0 | 80 | 176.6 | 176.6 | 11/9/2015 14:16:09 | Completed |
| 5 | Normal | Tail 7_1.8SG | | Cement Line | 15.02 | ☐ | 3.8 | ☐ | 0 | 80 | | 9.4 | 11/9/2015 14:59:37 | Completed |
| 6 | Normal | Water | | | 8.35 | | 3.1 | | | 80 | 3.1 | 3.2 | 11/9/2015 15:01:50 | Completed |
| 7 | Normal | Mud 1.24 | | | 10.43 | | 3.8 | | | 80 | 31.7 | 35.7 | 11/9/2015 15:02:35 | Completed |
| 8 | Job End | | | | | | | | | | | | 11/9/2015 15:15:41 | |

FIG. 4.1

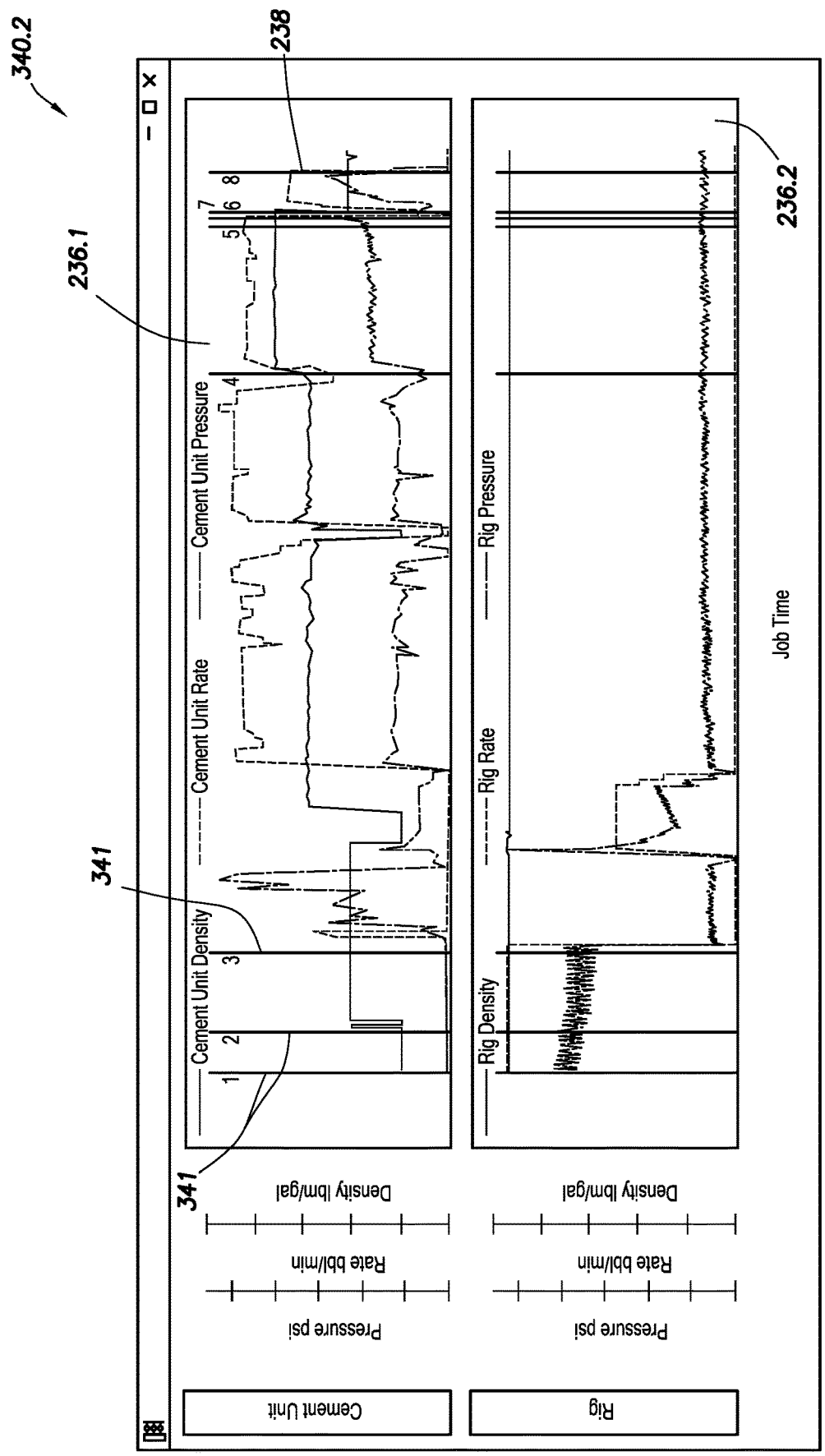
FIG.4.2

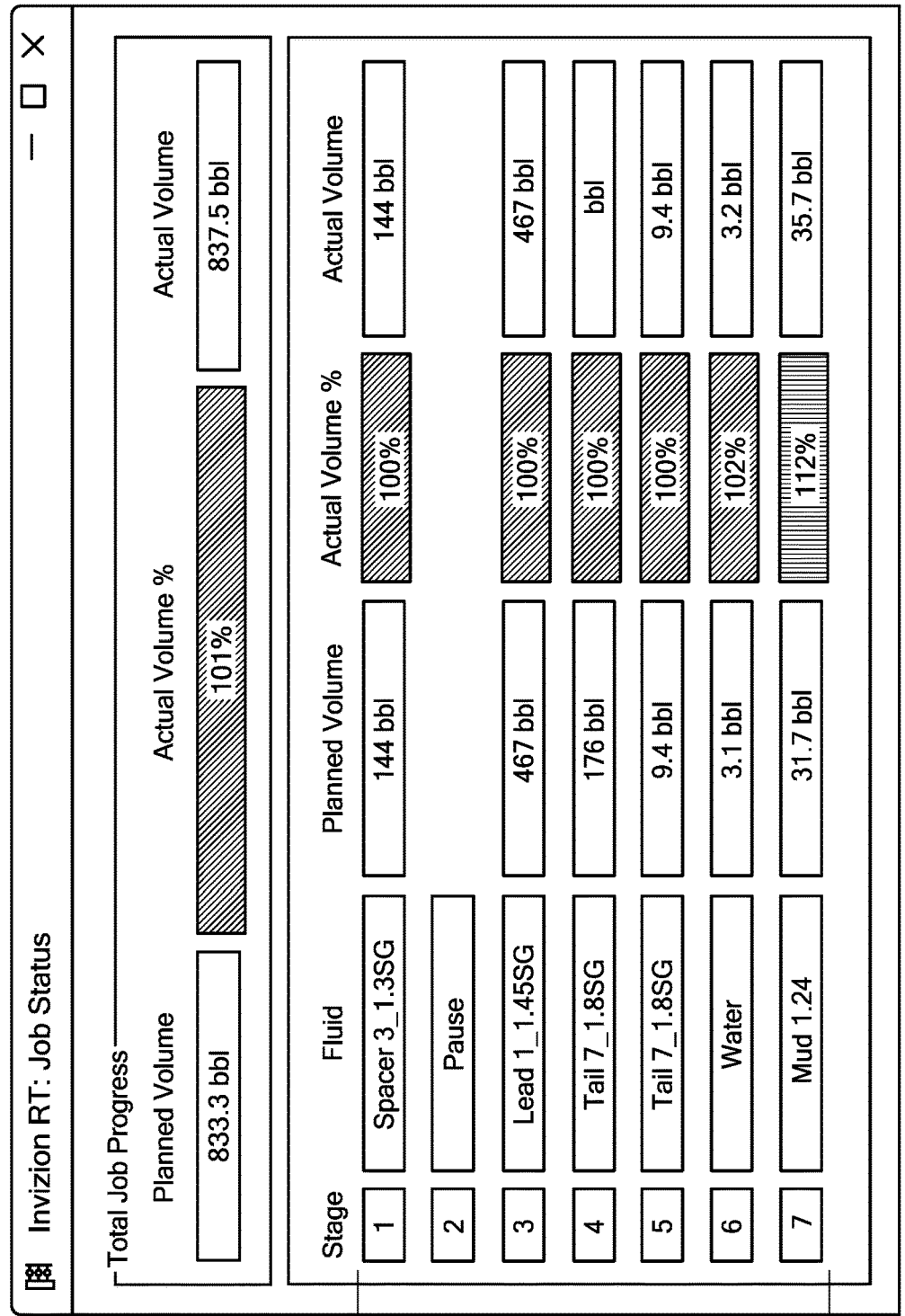
FIG.4.3

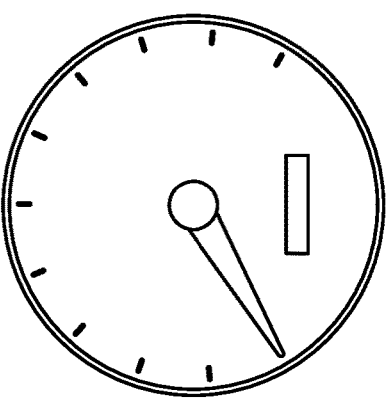
FIG.4.4

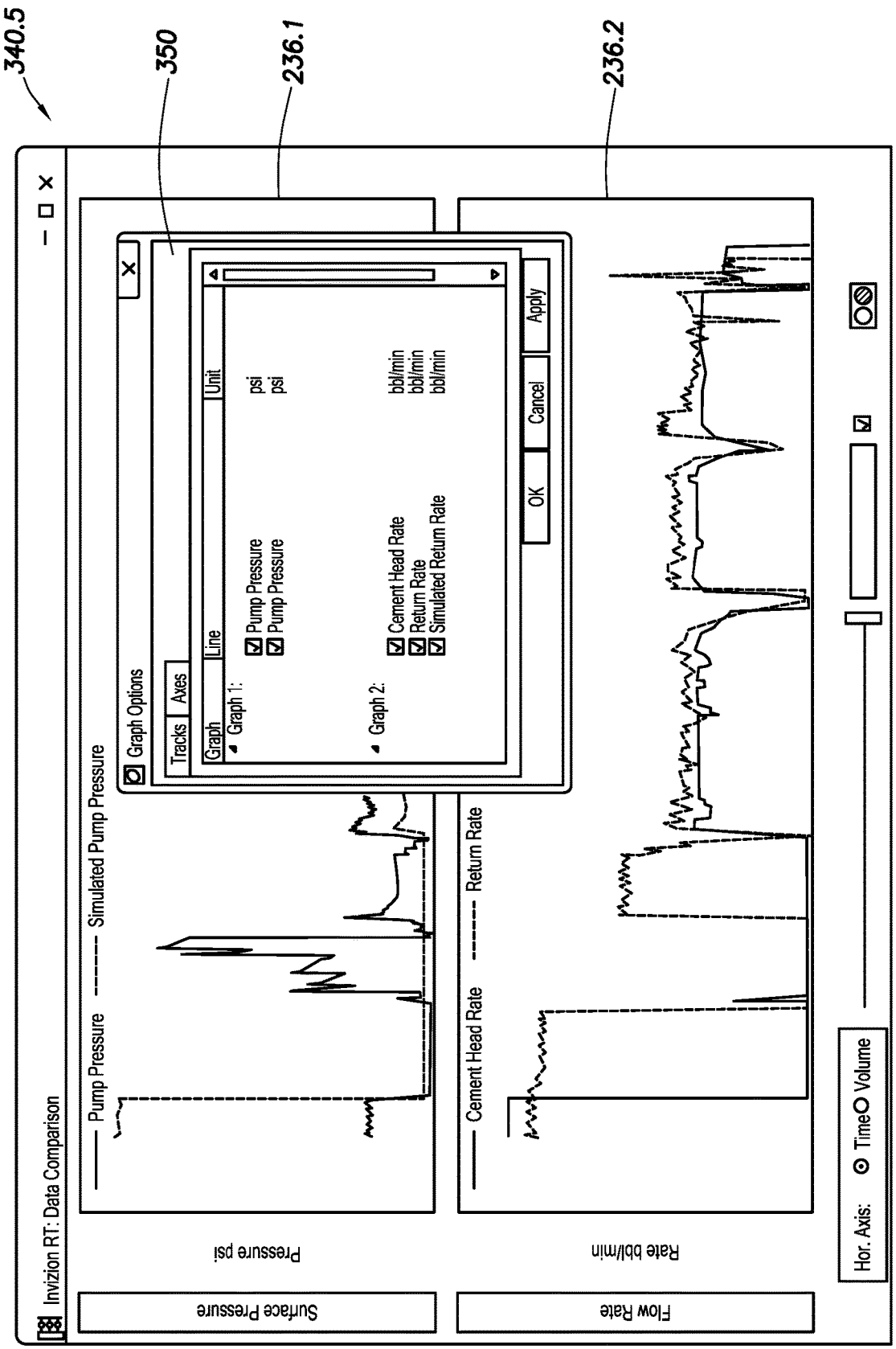
FIG. 4.5

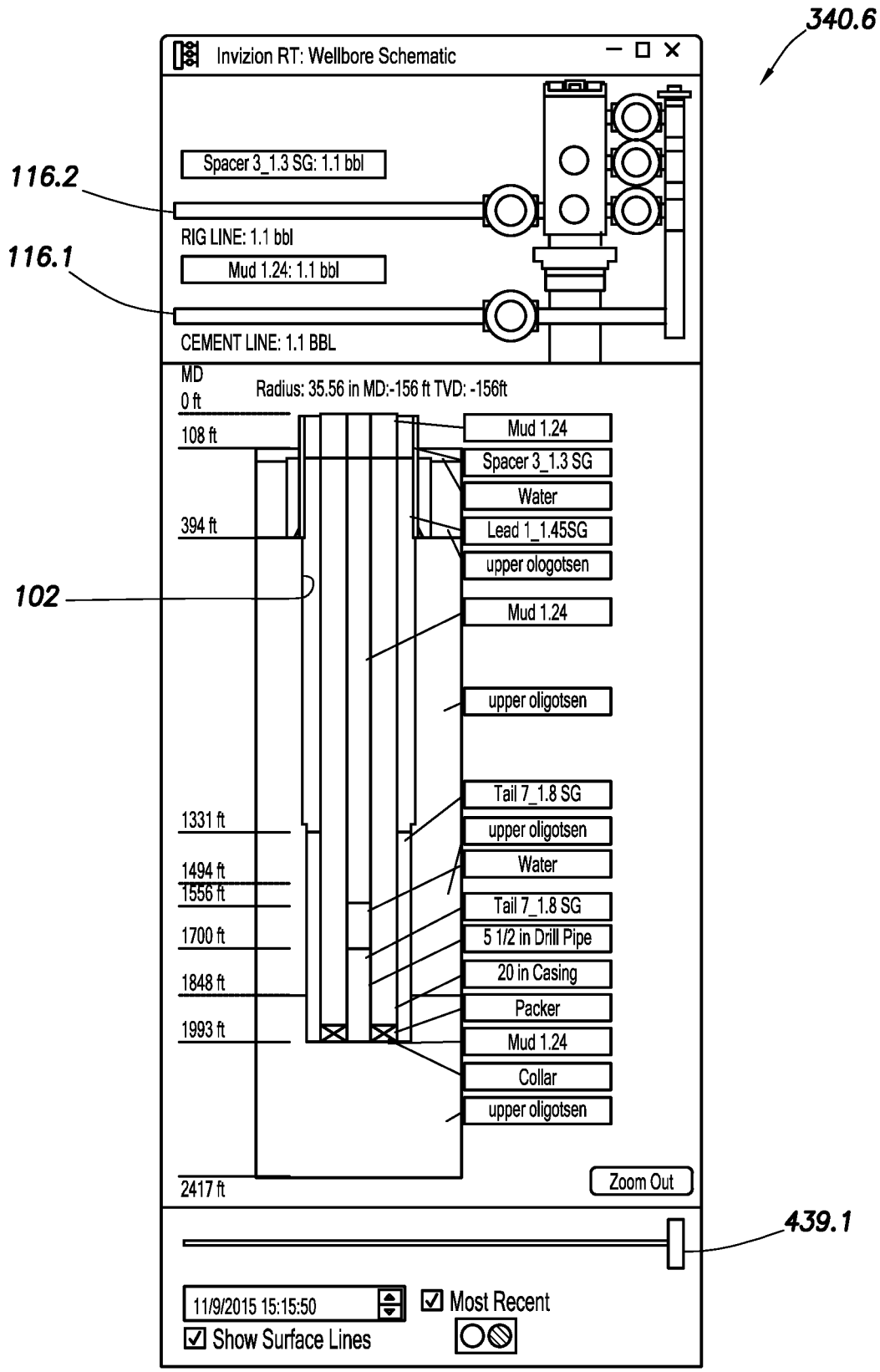
FIG.4.6

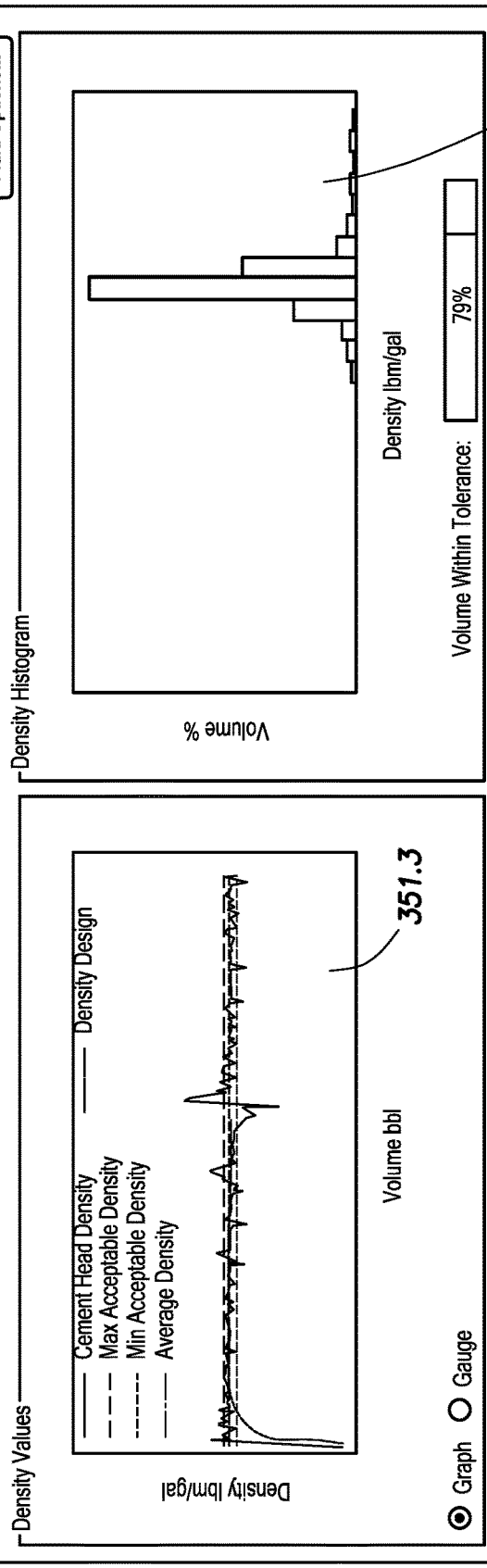
FIG. 4.7.1

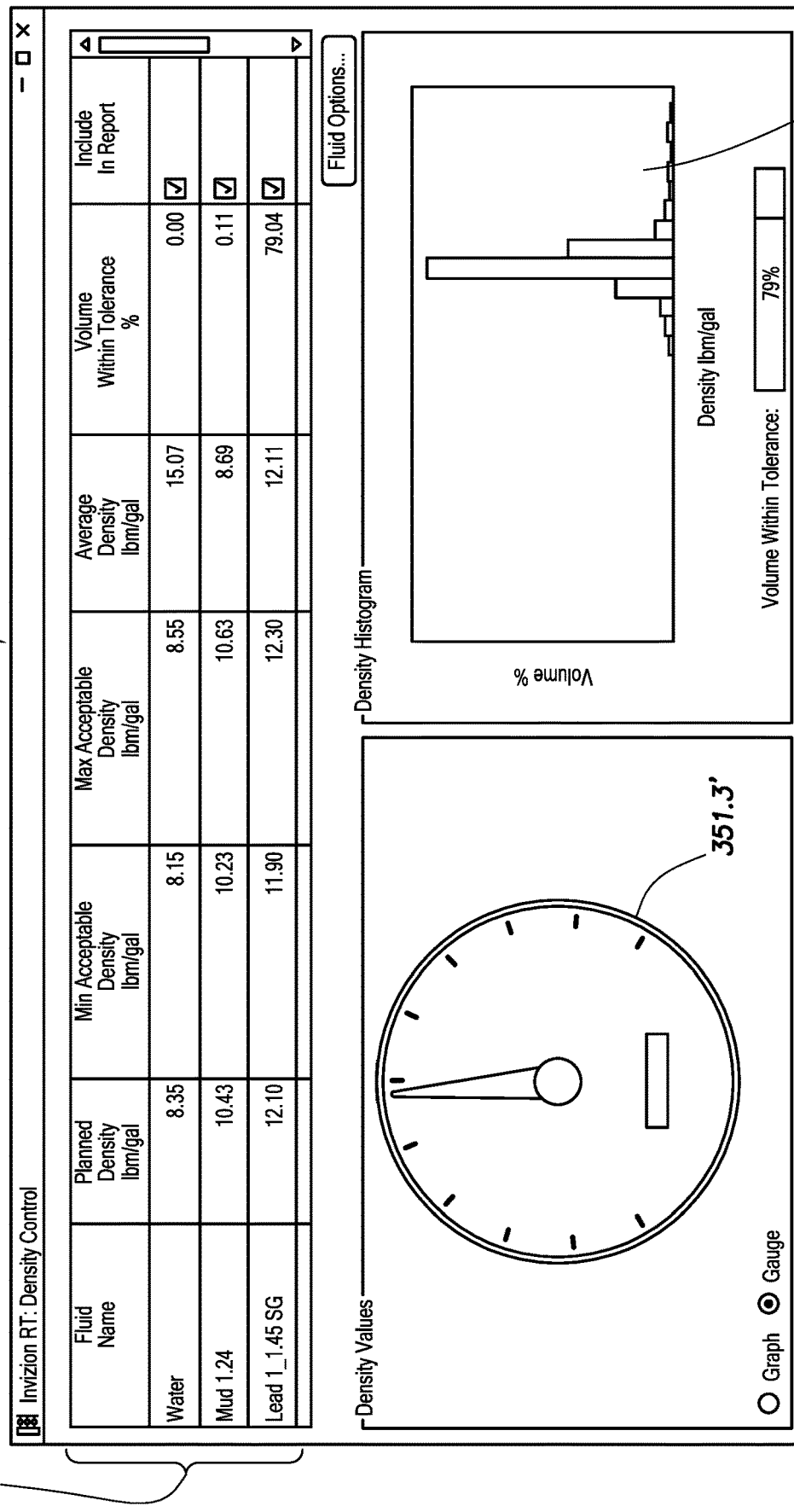
FIG.4.7.2

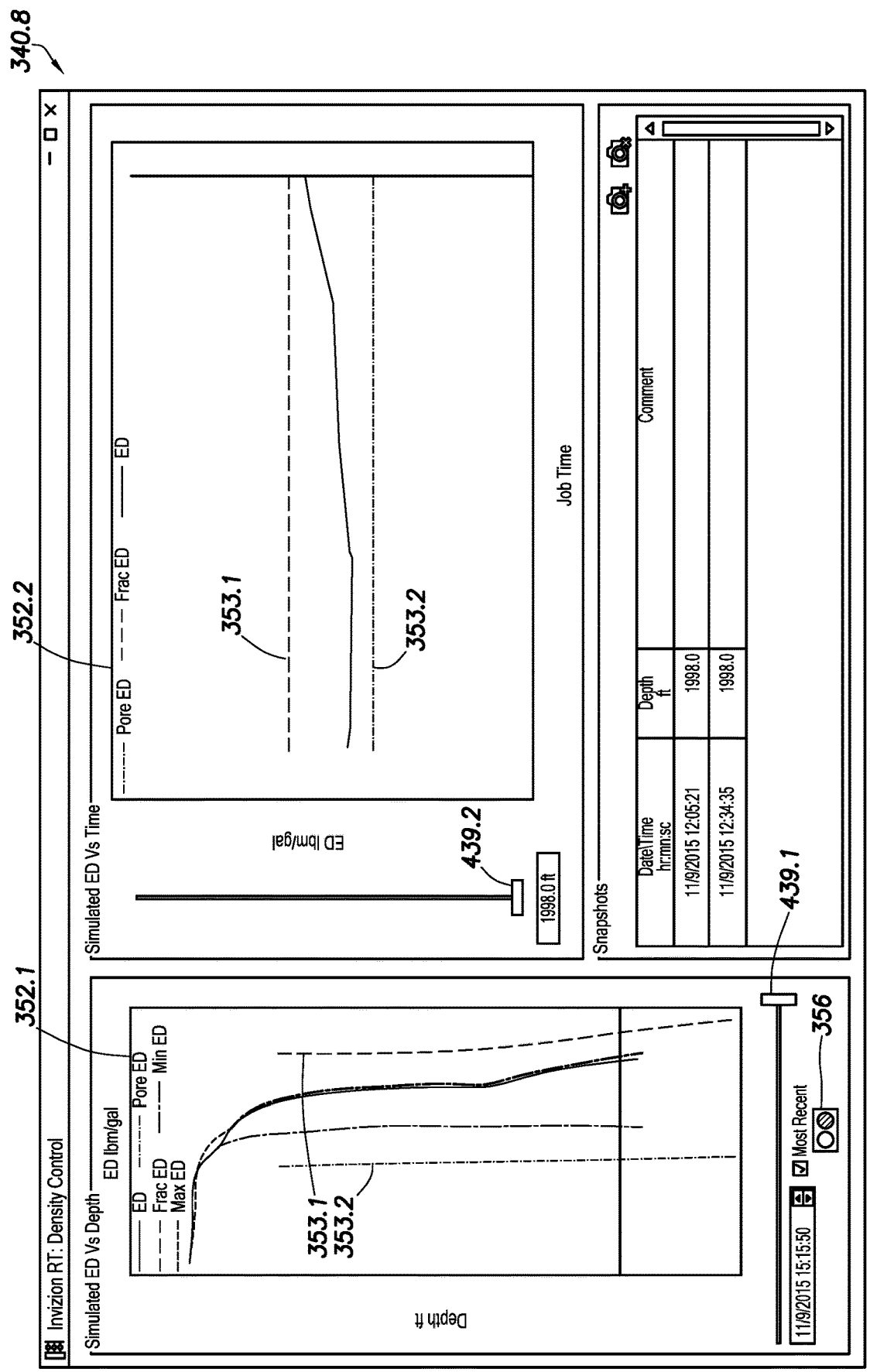
FIG. 4.8

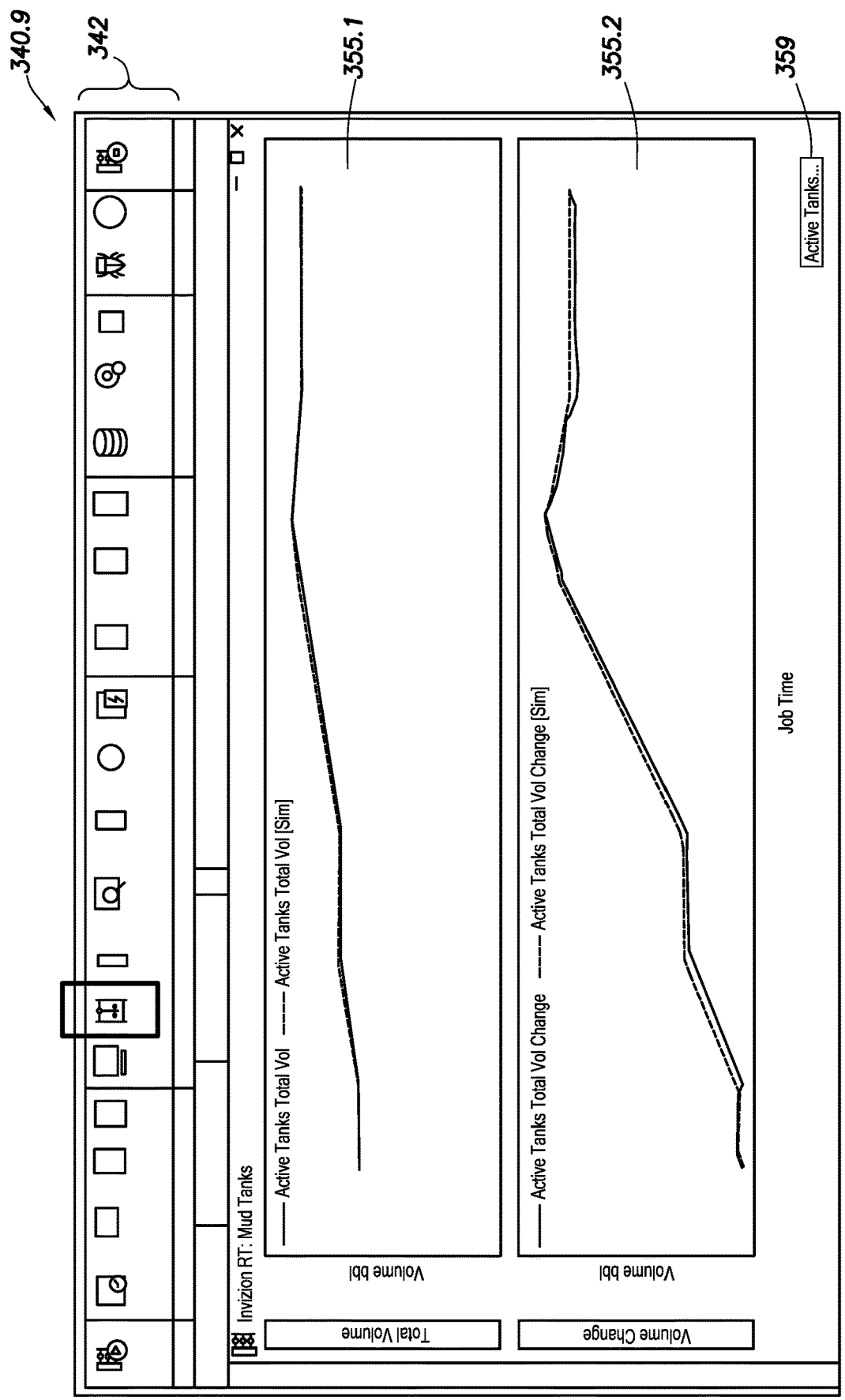
FIG.4.9

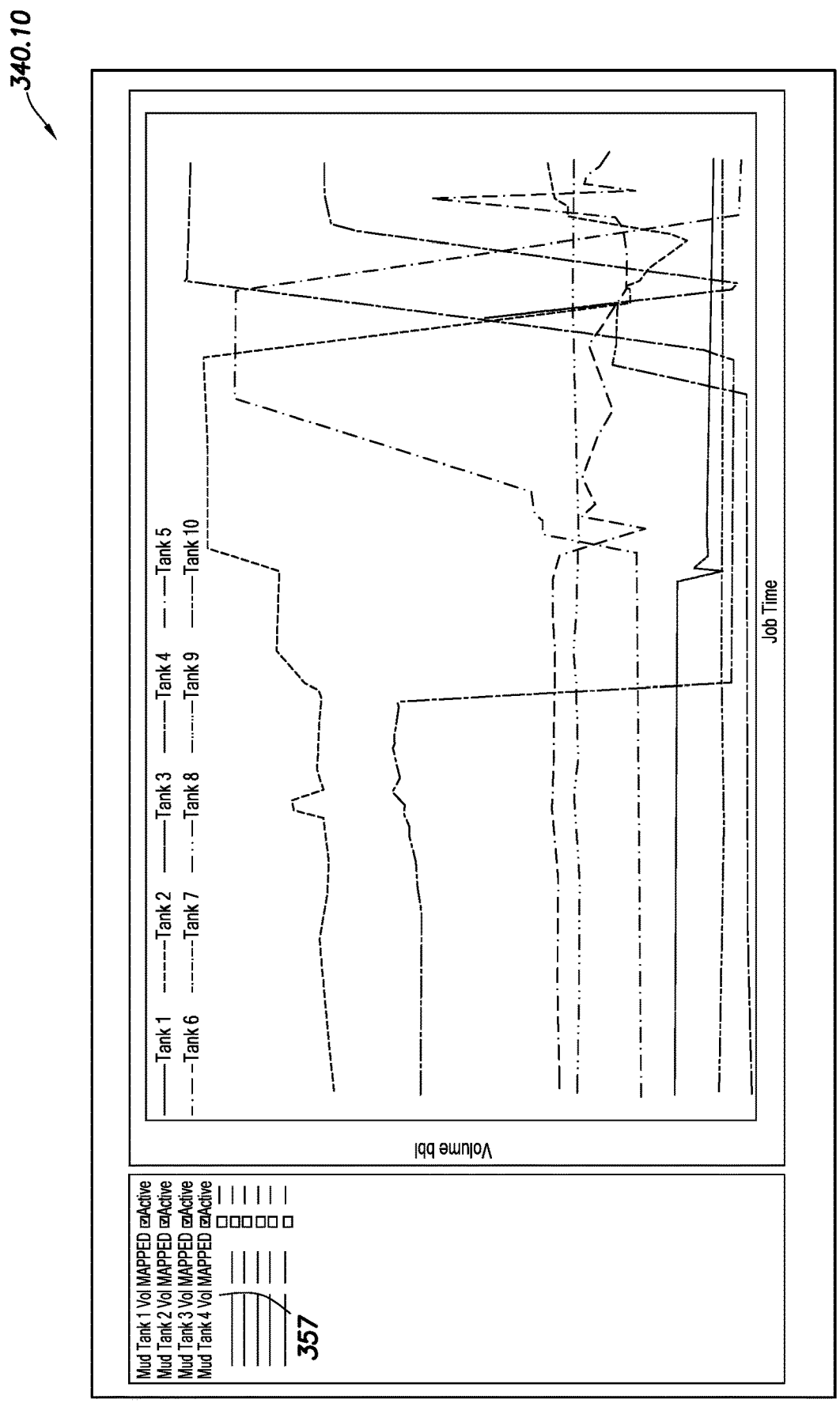
FIG.4.10

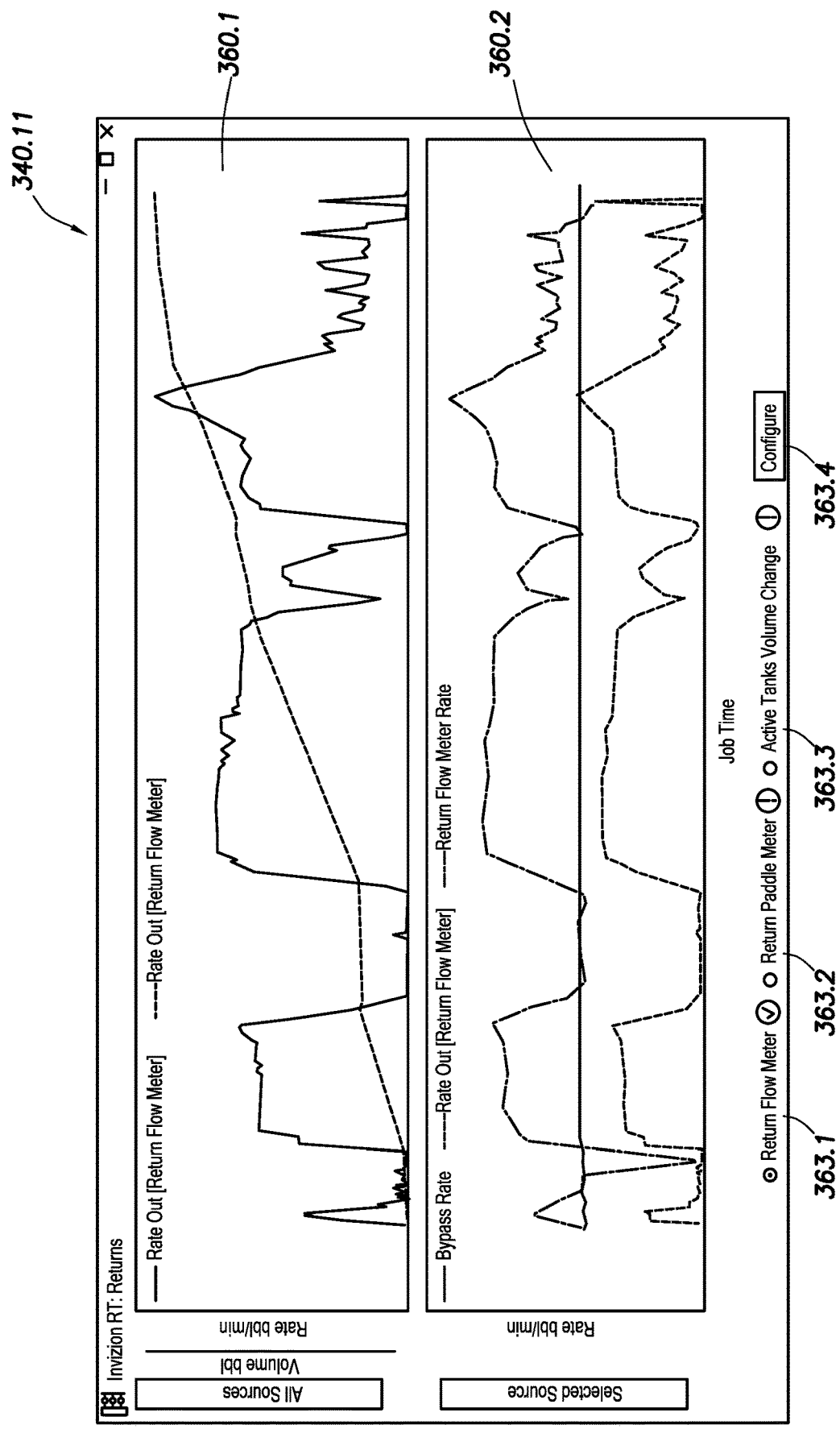
FIG. 4.11

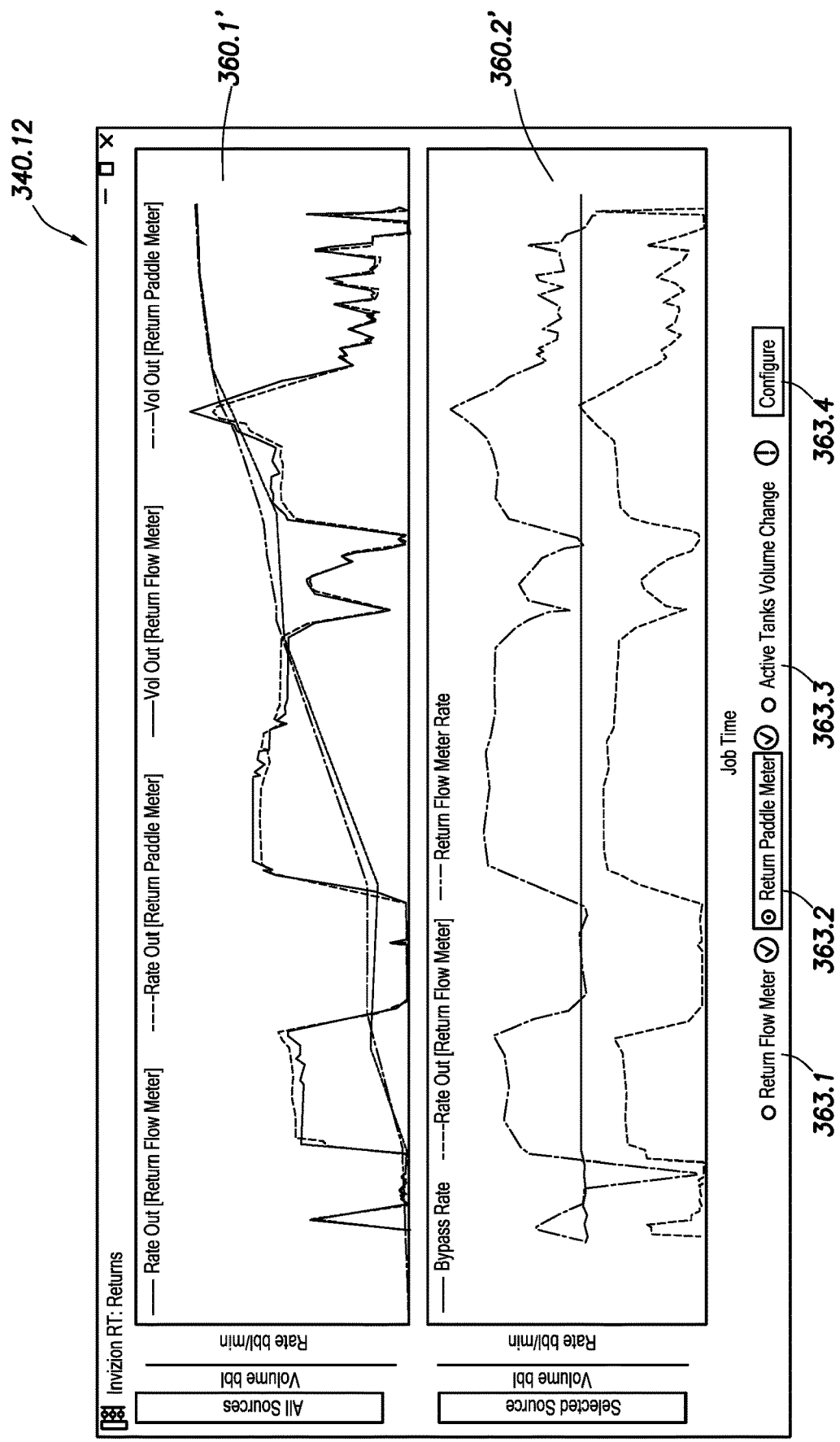
FIG.4.12

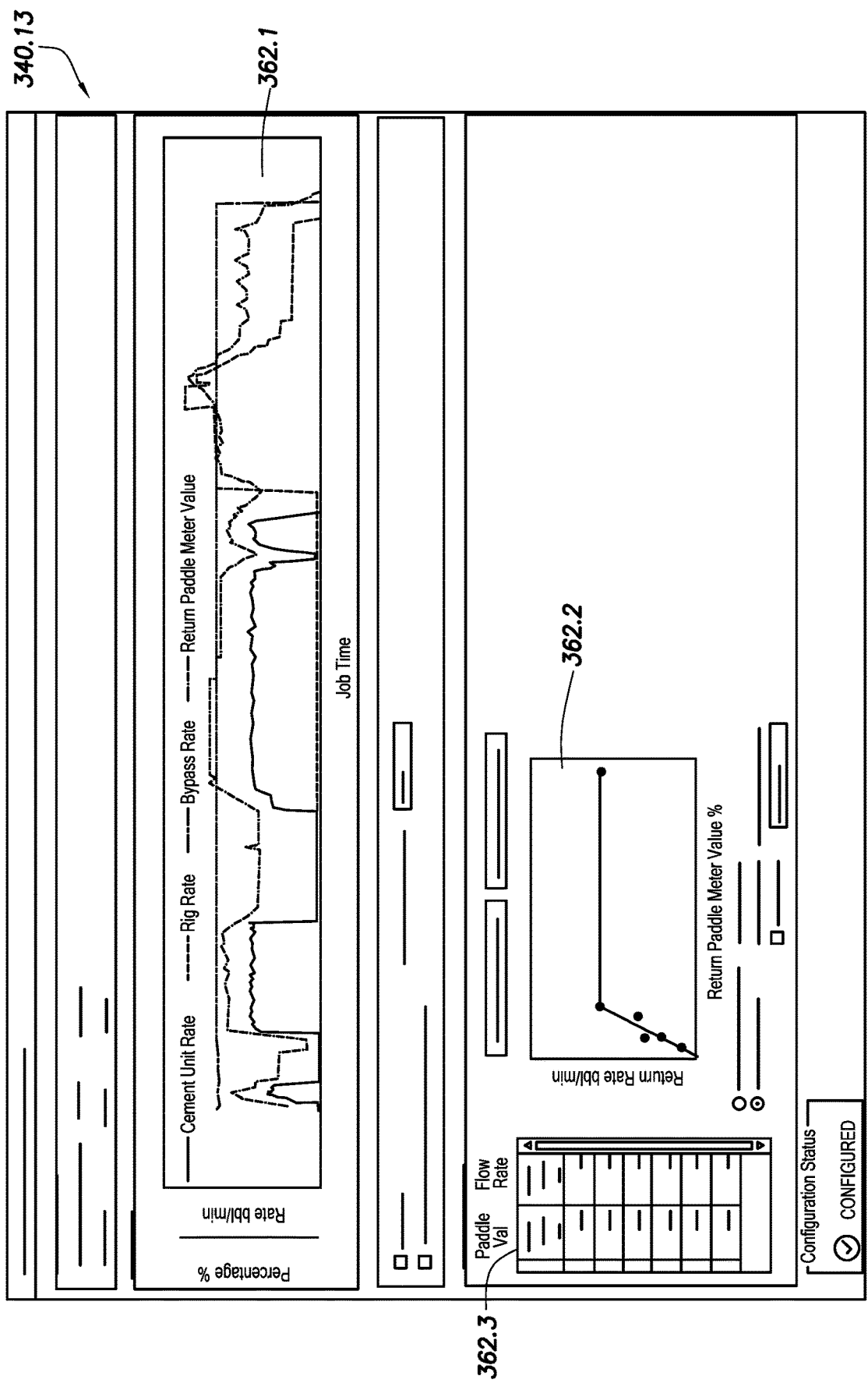
FIG. 4.13

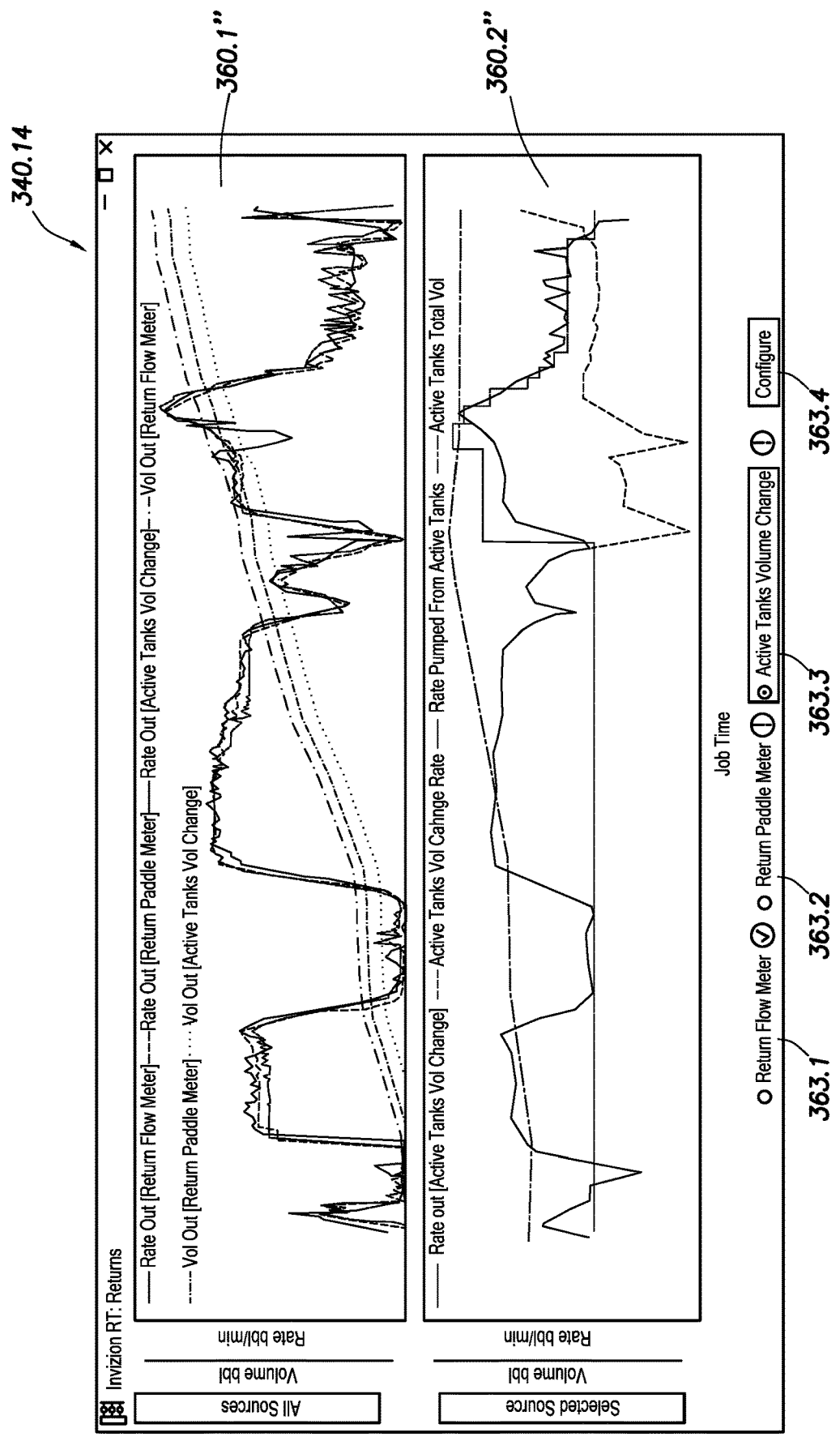
FIG.4.14

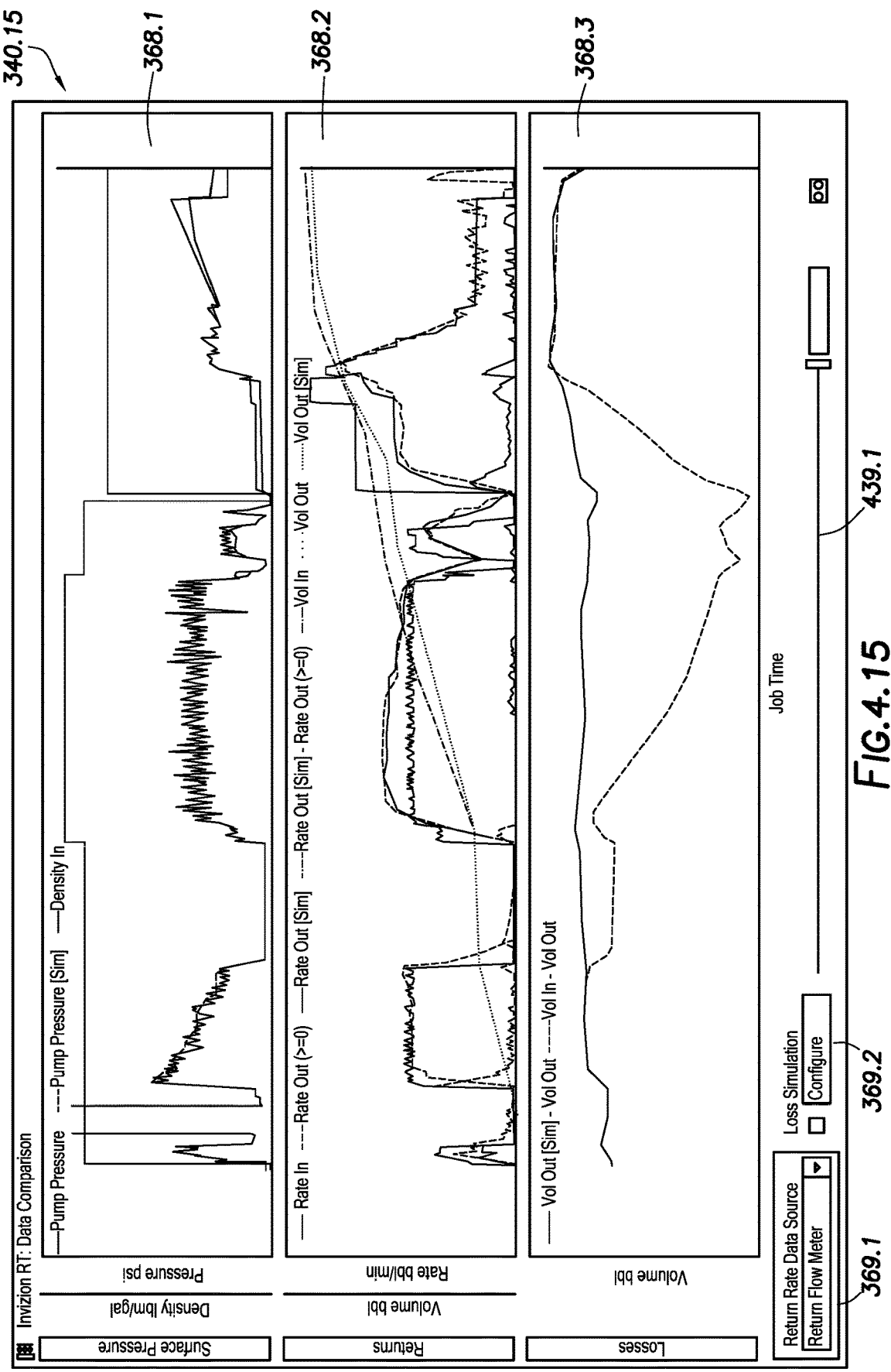
FIG. 4.15

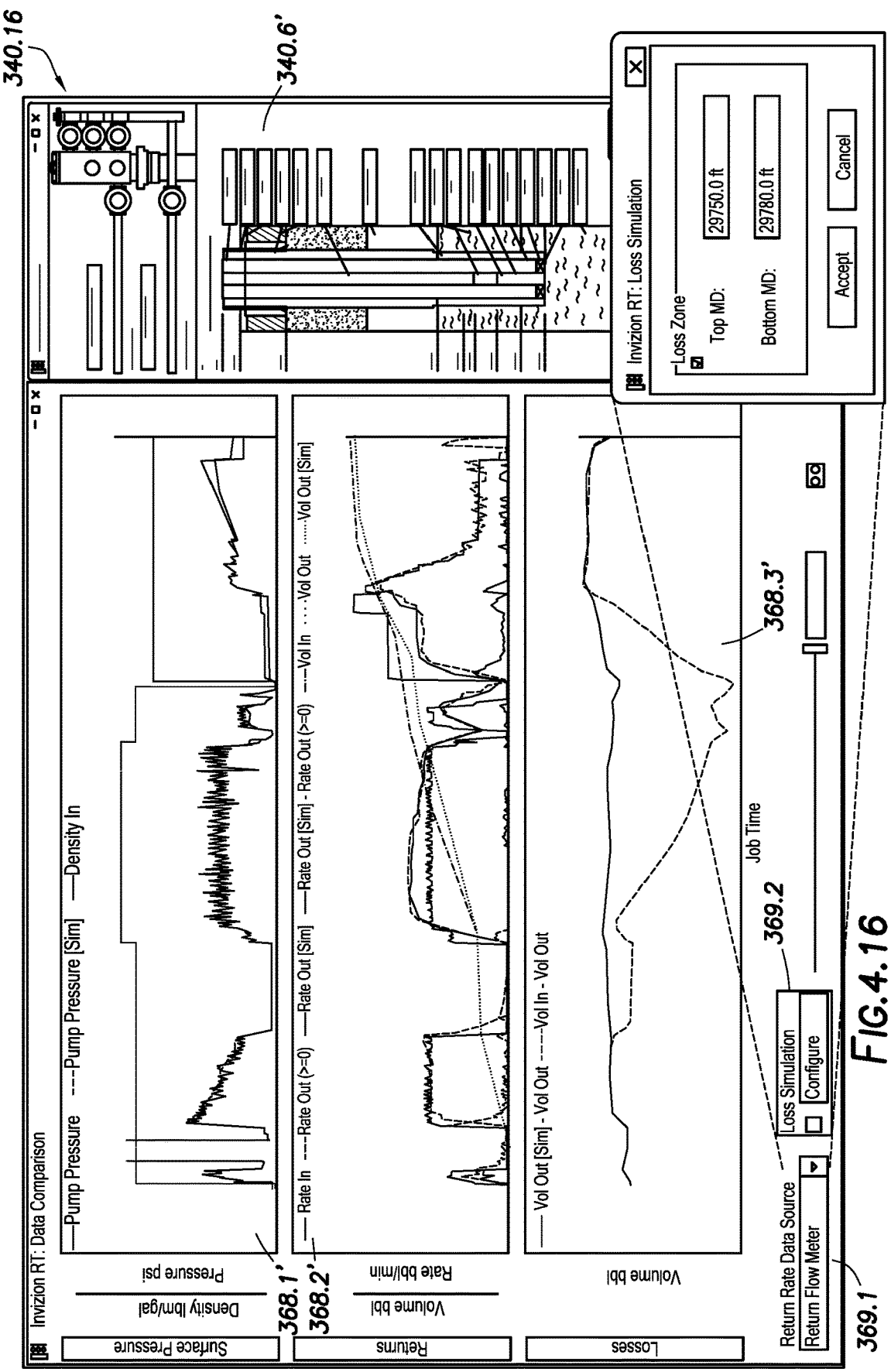
FIG. 4.16

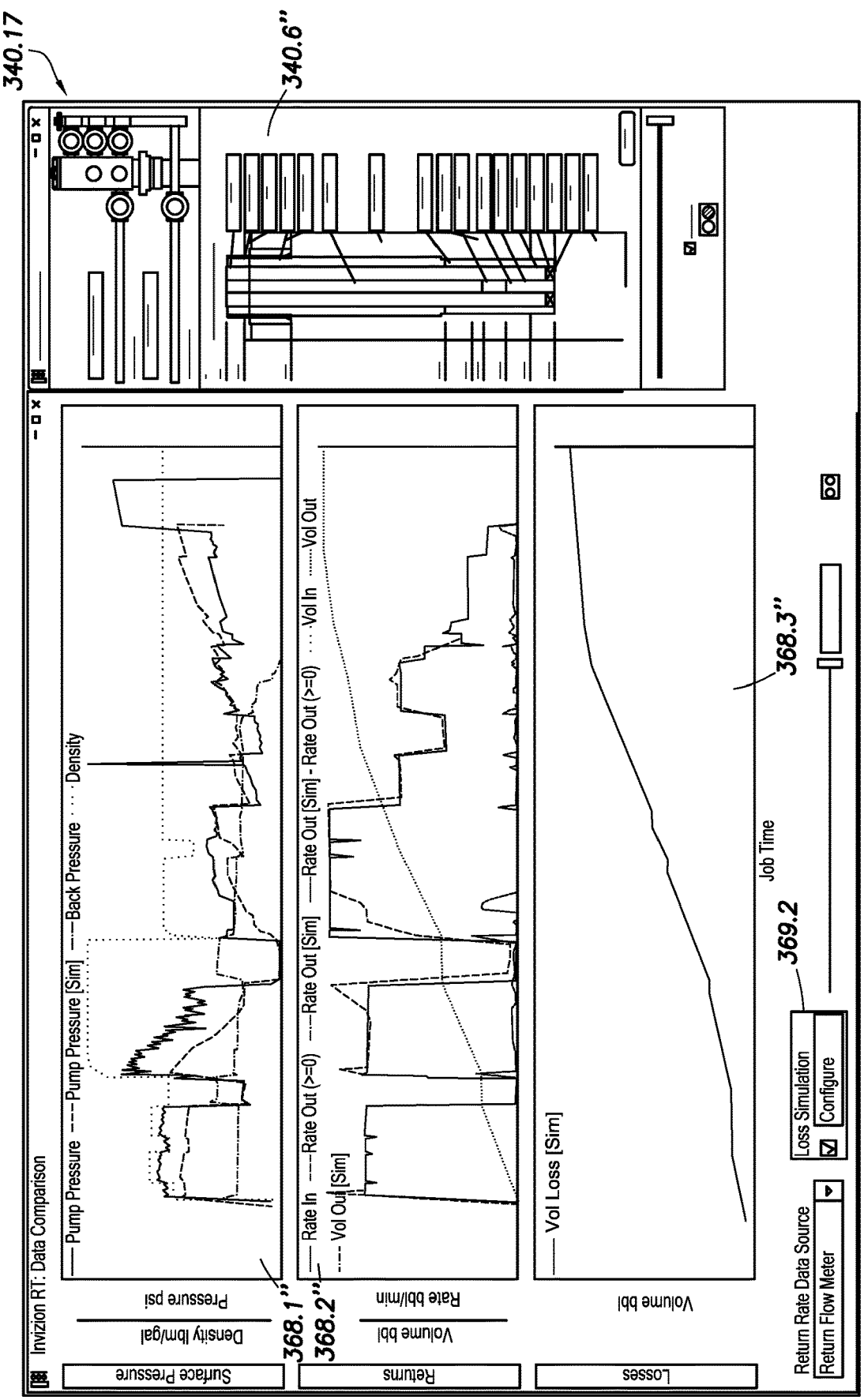
FIG. 4.17

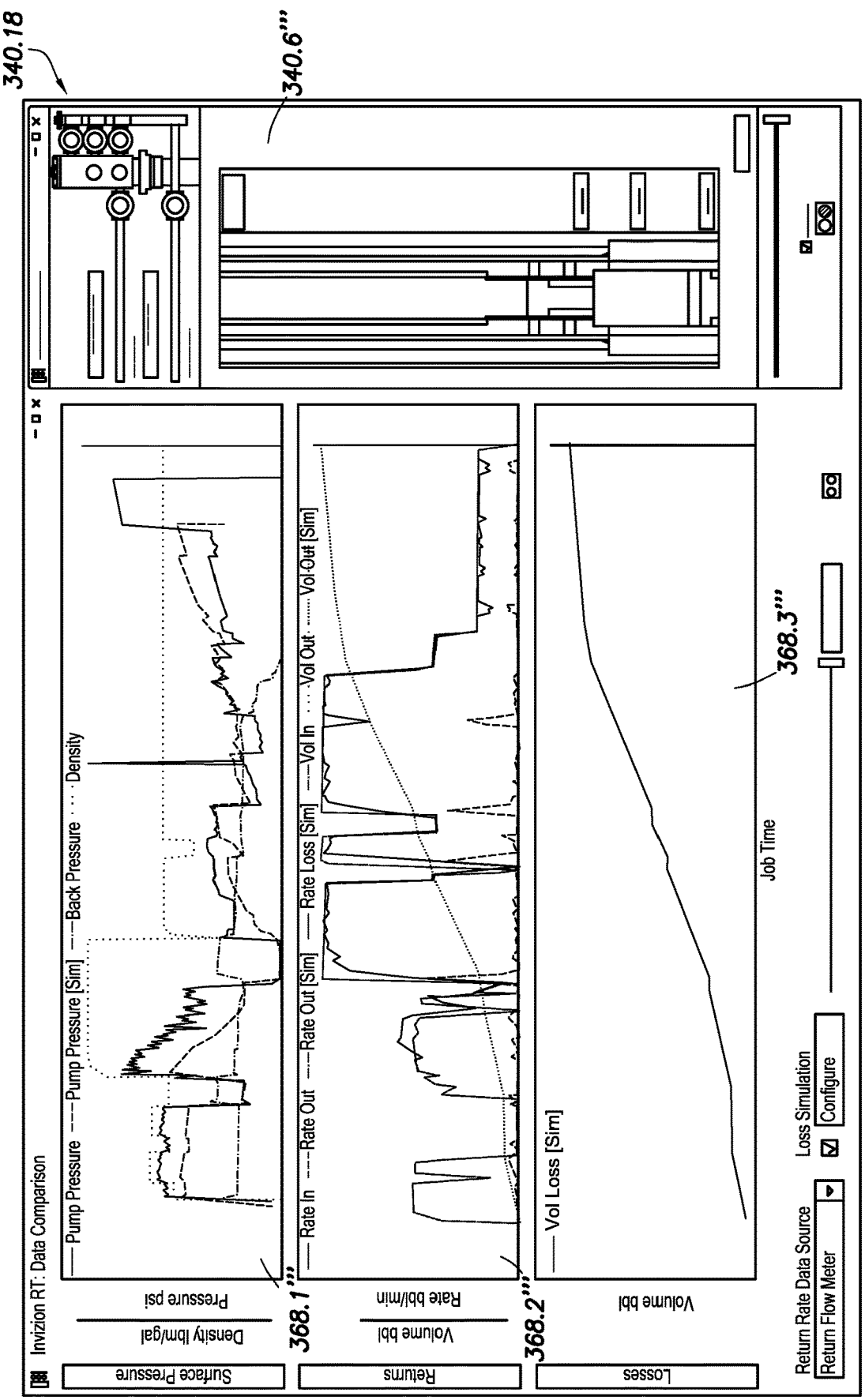
FIG. 4.18

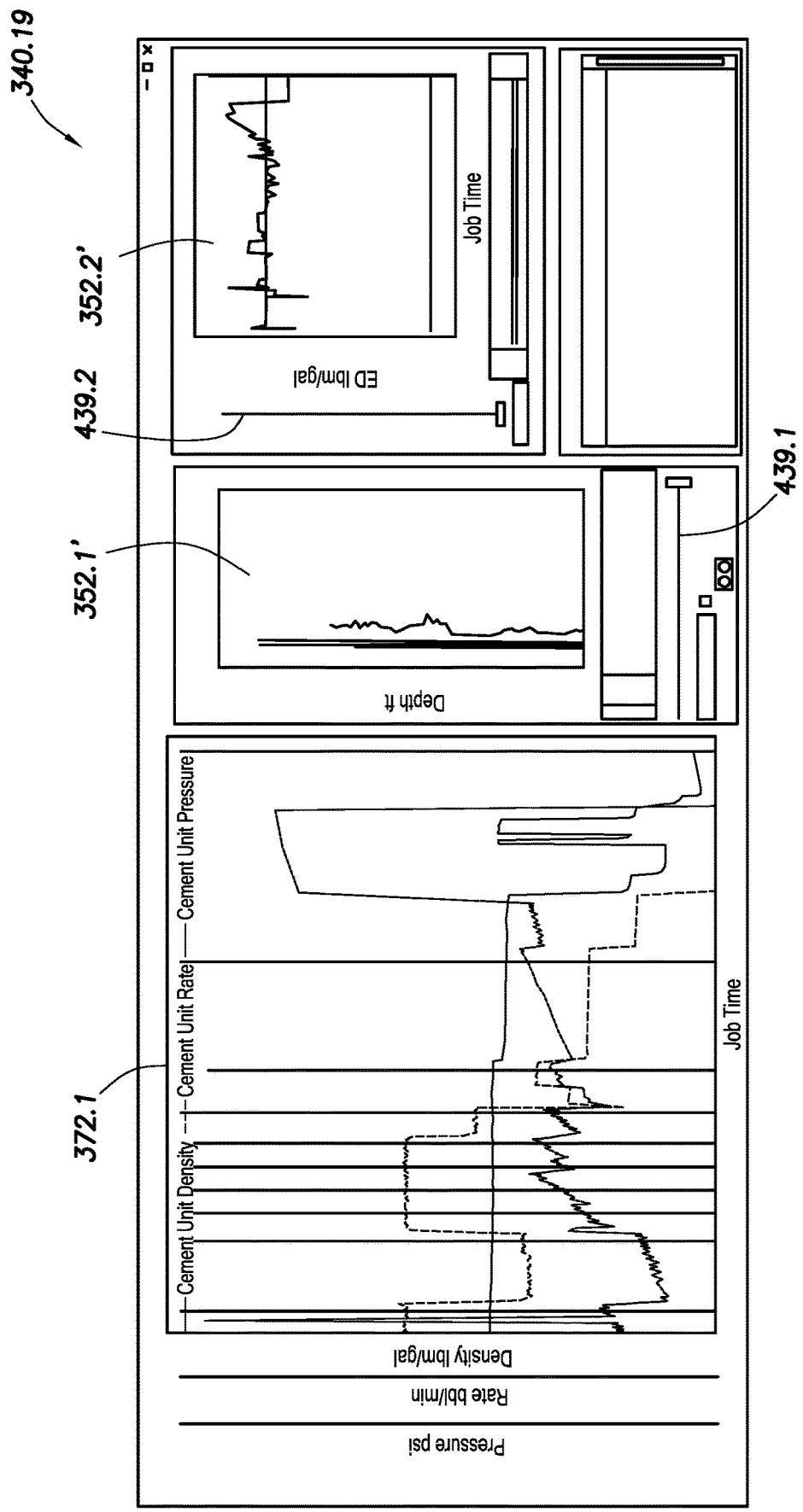
FIG. 4.19

SYSTEM AND METHOD FOR PERFORMING A REAL-TIME INTEGRATED CEMENTING OPERATION

CROSS-REFERENCE TO RELATED APPLICATIONS

This application is the National Stage Entry of International Application No. PCT/US2016/065690, filed Dec. 9, 2016, which claims the benefit of U.S. Provisional Applications Nos. 62/268,170 and 62/268,170, filed on Dec. 16, 2015, the entire contents of which are hereby incorporated by reference herein.

BACKGROUND

The present disclosure relates generally to techniques for performing wellsite operations. More particularly, this disclosure is directed to techniques for performing cementing operations at a wellsite.

Wells may be drilled to reach subsurface fluids, such as hydrocarbons. Once drilled, casing may be deployed into the wellbore to line and isolate zones along the wellbore. The casing may be cemented into place by pumping cement into the wellbore. The cement may be a slurry including a mixture of solids (e.g., binder) and fluids. The slurry may be mixed and pumped into the wellbore by surface equipment located at the wellsite. Examples of cements are provided in U.S. Pat. Nos. 8,251,143, 8,800,656, and 20110127034, the entire contents of which are hereby incorporated by reference herein.

The cement is pumped through the wellbore and into an annulus between the casing and the wall of the wellbore to secure the casing in place. Pumping tools may be used in pumping sequences to pump fluids and cement into the wellbore to place the cement in the annulus. Examples of cementing tools are provided in US Patent/Application Nos. 2015/0198009, U.S. Pat. Nos. 6,994,167, 7,464,757, and PCT Application No. WO2015/077524, the entire contents of which are hereby incorporated by reference herein.

Tools (e.g., sonic and logging tools) have been deployed into the wellbore to measure the casing and the cement. Examples of measurement tools are provided in US Patent/Application Nos. 2015198032 and U.S. Pat. No. 7,639,563, and PCT Application No. WO2016069597, the entire contents of which are hereby incorporated by reference herein.

Despite the advances in cementing techniques, there remains a need for advanced techniques for safely cementing the wellbore. The present disclosure is directed at meeting such need.

SUMMARY

In at least one aspect, the present disclosure relates to a method for performing an integrated cementing operation at a wellsite. The wellsite has a wellbore extending into a subterranean formation. The method comprises simulating a cementing operation for the wellsite. The simulated cementing operation comprises pumping sequences for selectively pumping drilling fluid and cement into the wellbore according to pre-operation simulated pumping parameters, measuring real-time pumping parameters of the drilling fluid and the cement pumped into the wellbore according to the pumping sequences, during the measuring, simulating real-time cementing parameters for each of the pumping sequences based on the measured real-time pumping parameters, and comparing the real-time simulated pumping parameters with the pre-operation simulated pumping parameters.

In another aspect, the disclosure relates to a method for performing an integrated cementing operation at a wellsite comprising designing a cementing operation for the wellsite by simulating pre-operation pumping parameters comprising cementing limits and pumping rates for a plurality of pumping sequences, performing the designed cementing operation at the wellsite using the simulated pre-operation cementing parameters, during the performing, measuring real-time pumping parameters of the drilling fluid and the cement pumped into the wellbore according to the pumping sequences, during the measuring, simulating real-time cementing parameters for each of the pumping sequences based on the measured real-time pumping parameters, displaying the real-time simulated pumping parameters with the simulated pre-operation pumping parameters and the cementing limits, and adjusting the cementing operation in real-time based on the displaying.

Finally, in another aspect, the disclosure relates to a method for performing an integrated cementing operation at a wellsite comprising pumping fluid into the wellbore at an input flow rate, measuring a return flow rate of the fluid as the fluid flows out of the wellbore, defining a loss zone within the wellbore, the loss zone having an upper zone limit and a lower zone limit, simulating the return flow rate based on the input flow rate, and generating a rate of the fluid loss from the loss zone such that the simulated return flow rate equals the measured return flow rate.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Embodiments of the system and method for performing the real-time integrated cementing operation are described with reference to the following figures. The same numbers are used throughout the figures to reference like features and components.

FIGS. 2.1-2.2 illustrate example views of the cementing system at the wellsite for performing a cementing operation involving monitoring and simulating, respectively;

FIGS. 4.1-4.8 illustrate the example outputs of the dashboard of FIG. 3;

FIGS. 4.9-4.19 illustrate additional example outputs usable with the dashboard of FIG. 3;

DETAILED DESCRIPTION

Figure 1:
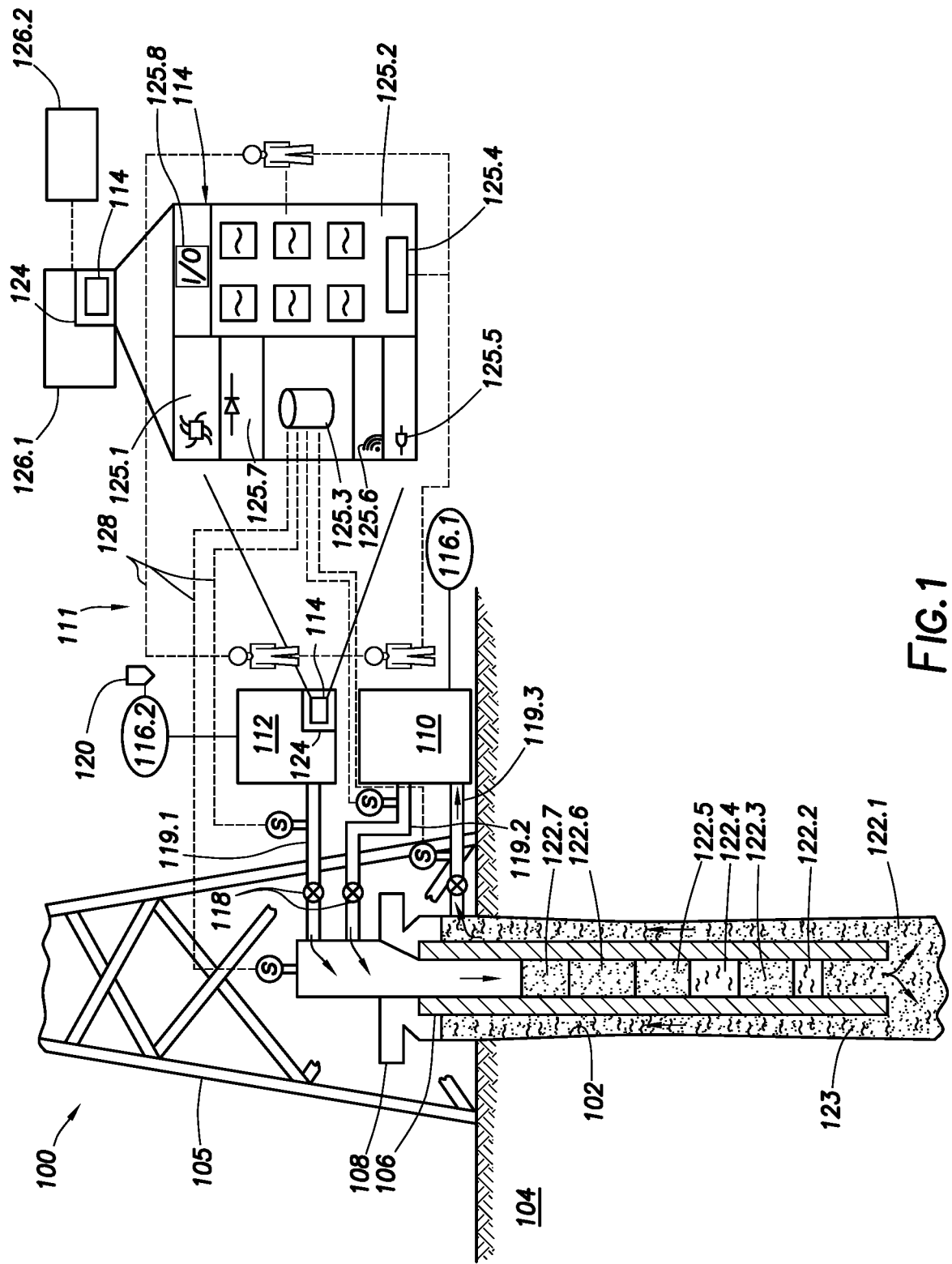
FIG. 1 is a schematic illustration of a cementing operation at a wellsite, the wellsite including a cementing system with a cementing component.

The description that follows includes exemplary apparatuses, methods, techniques, and instruction sequences that embody techniques of the inventive subject matter. However, it is understood that the described embodiments may be practiced without these specific details.

The present disclosure relates to techniques for performing wellsite operations, such as cementing operations. The cementing operations may involve pumping cement and/or fluids into the wellbore in pumping sequences to secure casing therein and/or to isolate portions of the wellbore. The cementing operations may also involve monitoring the pumping, measuring pumping parameters, simulating cementing parameters, adjusting the pumping, and/or other activities.

The present disclosure seeks to provide cementing operations that perform simulations in real-time as measurements are collected and as the pumping is performed, thereby providing information needed to adjust the cementing operations as they are performed. These simulations may be performed using software capable of performing simulations of cementing, hydraulic simulations, and/or simulations of other oilfield operations, such as CEMCADE™ and CEMENTICS™ commercially available from SCHLUMBERGER TECHNOLOGY CORPORATION™ at www.slb.com. The information may be provided in displays on a dashboard. The dashboard may permit automatic and/or manual adjustment of the wellsite from onsite and/or offsite locations. This may provide a monitoring system with feedback for real-time control of the cementing operation. With this system, measurements may be monitored and compared with simulations performed before and/or during operations. Such simulations may involve predicting the flow of fluid into/out of the wellbore, comparing measurements from various flow meters, considering backpressure, etc. Based on the simulations, adjustments may be made to the cementing operation as it is performed.

The real-time cementing operations may be used to assure that the cementing operation is performed within safety and/or operational limits. The feedback may assure that cementing provides an adequate seal about the casing and the wellbore to prevent fluid invasion into the wellbore (e.g., a blowout) and/or fracturing, and/or to optimize the performance of the cementing operation. The real-time cementing operations may also be used to gather input from on/offsite users, such as one or more operators, engineers, clients, and/or experts. The cementing operations seek to provide an integrated system that can supply information to the users in real-time as the cementing operations progress with enhanced monitoring of safety conditions, real-time adjustability of cementing operations, optimization of the cement placement, and/or the ability to meet the job objectives, etc. The cementing operations also seek to reduce the need for personnel on the rig, defects in well, fluid assumptions in cement job design, defects in job execution, and/or failures in meeting job objectives, etc.

Cementing Operations

FIG. 1 shows example cementing operation at a wellsite 100. The wellsite 100 has a wellbore 102 extending into a subterranean formation 104 below a rig 105. The wellbore has casing 106 therein supported about the wellbore 102 by a wellhead 108. The wellhead 108 is coupled to a cementing (or active) system 111. The cementing system 111 includes a rig pump 110, a cement pump 112, and a cementing component 114.

The rig pump 110 and the cement pump 112 are fluidly coupled to the wellhead 108 to pass fluids therebetween. The rig pump 110 and the cement pump 112 are also fluidly coupled to a fluid source 116.1 and a cement source 116.2, respectively. The fluid source 116.1 may contain water, drilling fluids, mud, and/or other fluids that may be passed into the wellbore 102 as schematically shown. The cement source 116.2 may be, for example, a tank containing a mixture of cement and fluid that may be passed into the wellbore 102 as also schematically shown. The cementing system 111 may include various devices, such as valves 118, a blender 120, etc., to provide the fluid, the cement, and/or other materials as needed.

A cementing operation may be performed at the wellsite 100 based on a well plan and/or cement design that defines the process to be implemented at the wellsite 100. The rig pump 110 and the cement pump 112 may be fluidly coupled to the wellhead 108 by flowlines 119.1, 119.2. The pumps 110, 112 may be used to pump the fluid and cement in pumping sequences 122.1-122.7 according to the cement design as schematically shown. In the pumping sequences shown, drilling fluid (e.g., mud) 122.1 then water (e.g., wash/spacer) 122.2 from the rig pump 110 is initially pumped into the wellbore 102, followed by cement (e.g., slurries) 122.3, 122.4 from the cement pump 112, followed by water (e.g., wash/spacer) 122.5 from the rig pump 110, and then displacement fluid 122.6 from the rig pump 110, and another (optional) fluid 122.7 from the cement pump 112.

While a specific configuration of the cementing operation is shown, various sequences of various amounts of fluids from the fluid source 116.1, cement source 116.2 and/or other materials may be provided in various numbers of pumping sequences. Various fluids, such as washers, drilling fluids, cements, and/or spacers may be pumped using the rig pump 110, the cement pump 112, and/or other pumps (e.g., positive displacement pumps).

The pumping may be monitored and/or controlled, for example, to vary fluid flow via sensors (e.g., pressure gauges) at various locations, such as at the rig, pumps, the cement head, wellhead, etc. Fluid flow may be varied, for example, by controlling flow rates at the well inlet and exit, a surface pressure (e.g., at the pump and at the wellhead), fluids densities at the well inlet and/or exit, and/or tank volumes through the sensors located in the rig mud tanks.

The wellsite 100 may be provided with sensors (S) to measure wellsite parameters, such as pumping and/or cementing parameters (e.g., flow rate, composition, pressure, volume, temperature, etc.), density, equipment parameters (e.g., dimensions, specifications, client data, measurements, etc.), and/or other parameters as desired. The sensors (S) may be gauges or other measurement devices positioned about the oilfield (e.g., at the cementing component and/or rig equipment) to collect data (e.g., measurements) relating to the various operations. Various sensors (S) may be located at various positions along the cementing system 111 and/or the wellsite 100 to collect and/or monitor the desired data. For example, sensors (S) may be positioned at the wellhead 108, flowlines 119.1, 119.2, pumps 110, 112, etc.

The fluids from the rig pump 110 and the cement pump 112 may be pumped into the wellbore 102 to drive the cement from the cement source 116.2 into an annulus 123 between the casing 106 and the wall of the wellbore 102. The cement 116.2 may be deployed into the wellbore 102 and positioned along the casing 106 to secure the casing 106 in the wellbore. The cement may also be positioned along the wellbore 102 (with or without the casing 106) to line and isolate the wellbore 102. The cement may provide zonal isolation along the wellbore 102 to prevent cementing defects, such as fluid invasion, and/or to prevent fracturing. The cement and/or fluids 116.2, 116.1 may be pumped in pumping sequences and/or have cementing parameters at given levels and/or limits to prevent cementing defects and/or to optimize the cementing operation.

As also schematically shown in FIG. 1, surface unit 124 may be provided at the wellsite 100 and/or an offsite (remote) location, such as an offsite facility 126.1 and/or a third party (e.g., client) facility 126.2. One or more of the surface units 124 may include the cementing component 114. The cementing component 114 may be integral with the surface unit 124 or coupled thereto for monitoring and/or performing cementing operations. The cementing operations may include, for example, opening and closing valves 118 to pass the fluids into the wellbore during the pumping sequences. The surface unit 124 and/or cementing component 114 may be manually and/or automatically operated by one or more on and/or offsite users.

The surface unit 124 and/or cementing component 114 may include various operating devices, such as a processor (e.g., CPU) 125.1, display 125.2, databases 125.3, controllers 125.4, power 125.5, communicators (e.g., transceivers) 125.6, electronics 125.7, and/or other devices, to perform the cementing operations. The database 125.3 may be communicatively coupled via the transceiver 125.6 to the sensors (S) to receive and/or store the measurements. The processor 125.1 may be used to generate the images for the display 125.2. The display 125.2 may include and/or be coupled to input/output devices 125.8, such as a mouse, keyboard, printer, monitor, etc.

The surface unit(s) 124 and/or cementing component 114 may be communicatively coupled via communication links 128 to one or more on and/or offsite locations. As schematically shown, communication links 128 may be established between various portions of the cementing system 111. The communication links 128 may be used to pass power, communication, control, and/or other signals for selectively performing cementing and/or other wellsite operations. Various on/offsite equipment may be connected via the communication links for communication between various users, such as operators and/or clients. Data having various formats, such as wellsite information transfer standard markup language (WITSML), may be communicated among the users.

Real-Time Monitoring & Simulation

FIGS. 2.1 and 2.2 show additional views of example cementing operations performed at the wellsite 100. FIG. 2.1 shows real-time monitoring. FIG. 2.2 shows real-time integrated monitoring and simulation. The integrated monitoring and simulation may be used to assure proper cementing of the wellbore and/or casing.

As shown in FIG. 2.1, fluid and cement from the rig pump 110 and/or the cement pump 112 is pumped into the wellbore 102 in pumping sequences as schematically shown. As also shown in FIG. 2.1, sensors are depicted as including densitometer 232.1, flow meter 232.2, and pressure gauge 232.3. These sensors 232.1-232.3 are positioned along the flowlines 119.1, 119.2 connecting the rig pump 110 and cement pump 112, respectively, to the wellhead 108. These sensors may be used to measure, for example, fluid parameters, such as flow rates, of fluids pumped into the wellbore 102 by the rig pump 110 and the cement pump 112.

The surface unit 124 is depicted as being coupled to the cement pump 112 for operation therewith. In this example, the surface unit 124 and/or cementing component 114 collect, store, process, and display the measurements 238 taken from the sensors 232.1-232.3. The cementing component 114 is schematically depicted as displaying images 236.1, 236.2 generated from measurements collected from the sensors 232.1-232.3 by the surface unit 124. The images 236.1, 236.2 are depicted as graphs of the measurements 238 from the sensors 232.1-232.3. Image 236.1 shows the pressure (P), rate (R), and density (D) measured by the sensors 232.1-232.3 over time from the rig pump 110. These and other versions of the data may be displayed on the display 125.2 of the cement and/or surface unit 114, 124 (FIG. 1).

FIG. 2.1 illustrates an example of real-time monitoring of cementing operations. The quantities measured in real-time at the cement pump 112 and/or rig pump 110 may be graphed and displayed in real-time. The quantities graphed in real-time as shown in FIG. 2.1 may be useful to allow on and/or offsite users to view measurements taken as they occur. The cementing component 114 may be employed as a real-time monitoring tool to further understand how the cementing operation (job) is progressing in real-time, and/or to provide other information, such as what might be happening downhole, what the quality of the job is, where fluid interfaces are positioned in the well, and/or quantities associated with well security (such as equivalent circulating density at any depth in the well).

As also schematically shown in FIG. 2.1, the cementing operation at the wellsite 100 may be performed based on a pre-defined well plan 233. The well plan 233 may include a cementing program to provide a pre-designed series of steps to be performed in sequence to cement the wellbore 102. The cementing program may include, for example, a job schedule with an itemized list of pumping sequences for pumping fluid and/or cement from the pumps 110, 112 into the wellbore 102. The well plan 233 may be based, at least in part, on pre-simulations 235.1 performed prior to the cementing operation based on wellsite data and/or other input information about the wellsite and/or cementing operation to be performed. As also schematically shown, certain inputs and/or design parameters, such as wellsite and/or equipment data and/or settings 229 (e.g., wellbore geometry, fluid properties, directional survey, formation properties, etc.), may be input into the pre-simulations 235.1.

Integrated real-time monitoring involving simulations is shown in FIG. 2.2. FIG. 2.2 is similar to FIG. 2.1, with an additional fluid return flowline 119.3 extending from the wellbore 102, and with a different view of the cementing component 114. While not shown in FIG. 2.2, the cementing operation may be performed based on the pre-defined well plan 233, inputs 229, and/or pre-simulation 235.1 as shown in FIG. 2.1.

As shown in this version of FIG. 2.2, fluid (e.g., mud) may be pumped out of the wellbore 102 via flowline 119.3. Sensors, such as the densitometer 232.1 and flow meter 232.2 as shown, may be provided in the return flowline 119.3. Fluid pumped through the return flowline 119.3 may recirculate back to the rig pump 110 and/or to another location. The annulus return flow rate and density measurements are shown as feeding into the surface unit 124 and cementing component 114 for hydraulic simulation. The sensors may be used to measure the same parameters of FIG. 2.1, and/or additional parameters, such as fluid loss detected between an amount of fluid entering and exiting the wellbore 102. Fluid loss may result from, for example, fluid passing from the wellbore 102 into the formation as schematically shown by arrow $F_L$. These measurements (and/or other design parameters) may be used as source of data to perform hydraulic simulations in real-time.

Measurements taken by the sensors in the flowlines 119.1-119.3 may be passed to the surface unit 124 and/or the cementing component 114. The cementing component 114 as shown may be used to receive the measurements 238 from the sensors 232.1-232.3 and process the measurements. The measurements 238 may be graphed and displayed in a display, such as the output 236.3 of real-time display of 125.2. The measurements 238 may also be passed to the processor 125.1 (FIG. 1) for processing the measurements. Processing may involve, for example, filtering, combining, separating, calculating, and/or otherwise manipulating the data as desired.

In the example shown, the processing in processor 125.1 performs real-time simulations 235.2 using the real-time measurements 238. As shown, the simulations 235.2 may involve performing calculations of conservation of mass, conservation of momentum, and conservation of energy as shown by the following equations:

$$\frac{\delta \rho}{\delta t} + \frac{\delta}{\delta x_i}(\rho u_i) = 0 \quad (1)$$

$$\frac{\delta p}{\delta t}(\rho u_j) + \frac{\delta}{\delta x_i}(\rho u_i u_j \; P_{ij}) = 0 \quad (2)$$

$$\frac{\delta E}{\delta t} + \frac{\delta}{\delta x_i}(u_i \; E \; u_j P_{ij} + q_i) = 0 \quad (3)$$

where E is energy, μ is flow velocity, P is pressure, ρ is density, x is a spatial coordinate, t is time. These equations are the Navier Stokes Equations for fluid flow usable in the hydraulic simulator. These and other calculations and/or processing may be performed.

The simulations 235.2 may be plotted with the real-time measurements 238 on display 125.2 for comparison as schematically shown. The simulations 235.2 may also be used to determine performance indicators 239, such as quality, well security, etc. for display on display 125.2'. The performance indicators 239 may be, for example, a graph of simulations 235.2 plotted against defined limits of operation as is described further herein. As also schematically shown, the measurements 238, simulations 235.1, 235.2, performance indicators 239, and/or other items may be displayed on display 125.2 for consideration by the users.

It can be seen in FIG. 2.2 that in addition to measuring and graphing quantities of fluids going into the wellbore 102 as shown in FIG. 2.1, measurements (measured quantities) may be fed into a hydraulic simulator running in real-time. An output from the real-time hydraulic simulation may then be used to compare measured and simulated quantities, as well as to compute other quantities, such as cement quality, well security quantities, fluid losses, etc., and/or to make these quantities available to the users in real-time.

FIGS. 2.1 and 2.2 outline examples of how the hydraulic simulation may be used in real-time, in combination with the other methods, to produce an integrated system for real-time monitoring & analysis of cementing operations. The monitoring system may tie together and display many types of information in real-time, as described herein, using various methods to provide a way for users to understand multiple aspects of the cementing operations, quickly and conveniently, while cement jobs progress in real-time.

Figure 3:
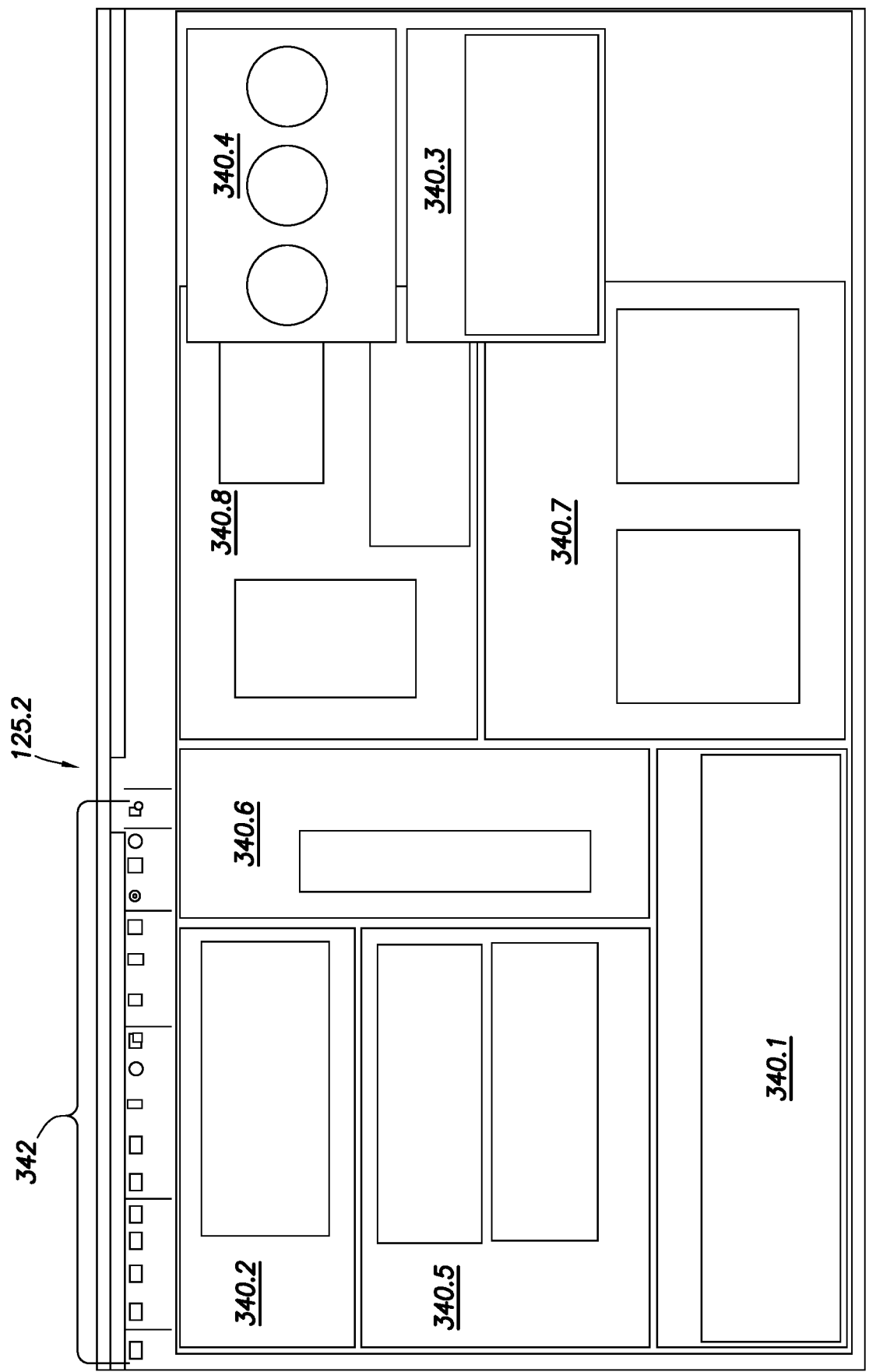
FIG. 3 illustrates an example view of a dashboard of the cementing component, the dashboard displaying example outputs.

FIG. 3 show an example real-time summary display 125.2 for displaying various outputs from the cementing component 114. Various combinations of various outputs, such as the images 340.1-340.8 shown, may be presented on the display 125.2 in the form of a dashboard. A graphical user interface (GUI) including the dashboard may be provided for use by the users. The users may have functions (or keys) 342 interactive with the processor 125.1 (FIG. 1) for manipulating the outputs presented on the display 125.2. As shown by these examples, the users may select the outputs and arrange layouts. The functions 342 may be used to select the outputs to be shown on the dashboard. Alarms may also be provided on the display when out of range (or specification) conditions occur.

FIG. 3 presents real-time summary displays of a number of methods, employed in real-time, to tie together, and present in unison, various types of information that may be useful to cementing operations. Each of the outputs 340.1-340.8 shown in FIG. 3 are described in more detail herein.

FIGS. 4.1-4.19 show example outputs usable on the dashboard of FIG. 3. FIGS. 4.1-4.8 show the outputs 340.1-340.8, respectively, of the dashboard of FIG. 3 in greater detail. These outputs display various features of the cement operation, such as job schedule 340.1, stage adjustment 340.2, job status 340.3, stage status 340.4, data comparison 340.5, wellbore schematic display 340.6, density control display 340.7, 340.7' and well security display 340.8. FIGS. 4.9-4.19 show the additional outputs 340.9-340.19, respectively, relating to mud system volumes, return flow rates, losses and loss simulations, and back pressure as described further herein. Various outputs featuring various aspects of the cementing operation may be displayed in various configurations as selected by the users.

The job schedule 340.1 is shown in FIG. 4.1 and a corresponding stage adjustment 340.2 is shown in FIG. 4.2. The job schedule 340.1 comprises a sequential list of the pumping sequences 322 (see, e.g., 122.1-122.7 of FIG. 1). Corresponding pump parameters in cells 344 concerning stage type, line, density, pressure, temperature, volume, start time, status, and/or other features may be presented as shown by the example of FIG. 4.1.

The job schedule may include an automatic setting 346.1 shown as a check box called "advance stages automatically" in FIG. 4.1. When this box is checked, the pumping sequences 322 are advanced automatically by the cementing component 114. The cementing component 114 may perform a cementing operation involving integrating flow rate during each pumping sequence over time to compute actual volume pumped during each pumping sequence, automatically advancing to the next pumping sequence when computed pumping sequence volume reaches planned pumping sequence volume, searching for pauses while pumping and matching observed pauses to any pause pumping sequences entered as a "pumping sequence type" in the job schedule, and using measured fluid density as another indicator of pumping sequence change boundaries in some embodiments. The user can also manually advance and adjust pumping sequences using the "stage control" (pumping sequence control) buttons 346.2 on the job schedule 340.1 shown in FIG. 4.1.

The stage adjustment 340.2 of FIG. 4.2 comprises a graphical display of measured flow rate information for both the cement pump 112 and the rig pump 110 of FIG. 1. The plot of FIG. 4.2 shows the sensor measurements for the rig pump 110 and the cement pump 112 as shown in FIG. 2.1. This stage adjustment as shown is similar to the outputs 236.1, 236.2 displayed in FIG. 2.1. When presented with the job schedule 340.1, the stage adjustment 340.2 may display the measurements 238 in real-time according to the pumping sequence performed. Various portions of the outputs 236.1, 236.2 may be shown on the display 125.2 of FIG. 3.

The job schedule 340.1 and the stage adjustment 340.2 may work in unison and allow users to specify time boundaries for each sequential pumping sequence. These outputs 340.1, 340.2 may be used, for example, to provide an accurate specification of pumping sequence time boundaries used to provide accurate input information to the simulation, running simultaneously in real-time, about when each pumping sequence starts and ends, and what fluid is being pumped during each pumping sequence.

The stage adjustment 340.2 may include information about pumping sequence time boundaries in the measured time logs of the pump pressure, rate, and density measurements. These time boundaries may be determined by identifying vertical bars 341 on FIG. 4.2 corresponding to the pumping sequences 122.1-122.7 of the job schedule 340.1 of FIG. 4.1. A number on each of these bars corresponds to the number of the pumping sequence on the job schedule 340.1 in FIG. 4.1. In this case bars 1 through 8 are shown.

The vertical pumping sequence marker bars 341 on FIG. 4.2 are movable. The user can grab any of the vertical bars in FIG. 4.2, and simply drag the bars left or right (e.g., using a mouse or other input device) to change the time boundary for the associated pumping sequence. This allows the automatically determined pumping sequences 322 to be adjusted in real-time. When the pumping sequence bars 341 are repositioned by the user, pump parameters, such as actual volume and start time, may be updated in the job schedule 340.2 in FIG. 4.2. The job schedule 340.2 in FIG. 4.2 also allows the users to add & delete pumping sequences 322 in real-time, while cementing operations progress. In addition, all of the information in the cells 344 in FIG. 4.2 can be changed in real-time as cementing operations progress.

An example job status 340.3 summary is shown in FIG. 4.3. This figure shows overall progress of the cementing operations readily ascertained in real-time. The job status 340.3 may show a summary progress of the total job, as well as each of the individual pumping sequence 322 displayed in real-time, including cementing parameters, such as fluid type, planned volumes, actual volume percentages, and actual volumes.

An example pumping sequence status 340.4 depicting a detailed summary of the cementing operation is shown in FIG. 4.4. Details of the current pumping sequence can be ascertained from the pumping sequence status 340.4 in real-time. Certain pumping parameters may be displayed as gauges, and/or using simple numeric fields, to provide data in a paradigm that may be consumed by the users. In addition to displaying pumping sequence progress and pumping sequence parameters, alarms 345, such as pumping interruption can be included. The alarms may alert the user when the measurements indicate an out of specification condition.

An example data comparison is shown in FIG. 4.5. This output 340.5 shows results of real-time hydraulic simulation compared with measured quantities. This display 340.5 provides a real-time comparison of simulated quantities generated based on actual measurements of what is actually being injected into the well against the real-time measurements, such as those taken by the sensors (S) (see, e.g., FIGS. 2.1-2.2). The real-time hydraulic simulation may be a simulation performed during cementing operations using the measurements as they are generated as is described for example with respect to FIG. 2.2. Other parameters may also be plotted against the real-time simulations and measurements, such as the pre-operation simulations performed during planning prior to the cementing operations.

As shown by the example of FIG. 4.5, the data comparison 340.5 may include surface pressure and flow rate graphs 236.1, 236.2, respectively. As shown by the selection box 350, various items may be selected for display and comparison. This shows that the users can select a number of different quantities for display and comparison. Finally, the data can be graphed, for example, as a function of time or pumped volume.

An example wellbore schematic is shown in FIG. 4.6. The display 340.6 shows a schematic image of the wellsite 100, including the pumping sequences of cement 116.2 and fluids 116.1 pumped into the wellbore 102 (see, e.g., FIG. 2.2). This schematic 340.6 demonstrates that results of the real-time hydraulic simulation 235.2 provide estimates of fluid interface positions in the well. Data from the sensors (e.g., 232.1-3 of FIG. 2.2) may feed into the simulation to define the location of the stages in the wellbore. This schematic 340.6 provides computations and schematics that may account for movement and volumes of fluids in the flow lines.

The wellbore schematic 340.6 may be used to provide complete information about where fluid interfaces are positioned in the wellbore 102. In addition, a time slider 439.1 is provided to allow the users to "go back to any previous time" and seeing where fluids were positioned at that time. By moving the time slider 439.1 back and forth, the time during the cementing operation may be selected to see the corresponding measurements at that period in time on the output 340.6.

Example density control outputs 340.7, 340.7' are shown in FIGS. 4.7.1 and 4.7.2, respectively. These display density distributions in real-time. As shown in the example of FIG. 4.7.1, the display 340.7 may include a summary 351.1 of fluid parameters, a bar graph 351.2 of volume percent by density, and a line graph 351.3 of density by volume. As shown by FIG. 4.7.2, the display 340.7' may include a gauge 351.3'. While density is shown in the displays 340.7, 340.7' in a specific format, other parameters may be displayed in various formats.

An example well security output 340.8 is shown in FIG. 4.8. The output 340.8 includes plots 352.1, 352.2 displaying ED (equivalent (or effective) density) as functions of both time and depth in real-time, respectively. The ED is the density exerted by a circulating fluid against the formation that takes into account the pressure drop in the annulus above the point being considered. The ED may be calculated from the following:

$$ED = d + P/0.052*D \tag{4}$$

where ED is the equivalent density (ppg), d is the mud weight, P is the pressure drop in the annulus between depth D and surface (psi), and D is the true vertical depth (feet).

Upper and lower limits 353.1, 353.2 are also displayed to represent operational limits for cementing operations. The upper limit 353.1 defines a level at which fracturing may occur which may be determined for each pumping sequence. The lower limit 353.2 defines a level at which fluid invasion into the wellbore may occur which may be determined for each pumping sequence.

The "simulated ED vs. depth" plot 352.1 has the time slider control 439.1, while the "simulated ED vs. time" plot 352.2 has a depth slider control 439.2. This combination display uses these two slider controls 439.1, 439.2 to allow the user to examine ED over time and depths in a convenient and meaningful way. For example, when the time slider control 439.1 is moved in one window, the sliders controls 439.1, 439.2 move to the same time value in all windows. Vertical lines on the various graphs show where the time value is set at any given time. An indicator 356 (e.g., red/green image) may be used to alert the users whether the user is looking at the "most recent" data, or whether the user has "moved back to a previous time" to display various data.

The fluid interfaces in the wellbore schematic may move to the same time where data is being displayed in all of the other windows 340.1-340.8. The combined result of synchronous calculation & display updates provides a view of the entire cementing operation and a tool to do in-depth analysis over the entire history of the job.

This combination of real-time computed ED (equivalent density) values (from the real-time hydraulic simulation) along with a unique data visualization method may be used for monitoring and analysis of well security information in "real-time". This may provide an ability to compute ED based on the real-time simulation, which may be based on measured quantities actually entering the well during the job. The combination of accurately simulated ED values available in the paradigm of the dual display over depth and time may provide an analysis tool to help ensure well security during cementing operations.

The displays 340.1-340.8 provided herein may be used to provide synchronous calculation and display updates in real-time. The users may go to any of the displays presented herein, make some adjustment (changing a time slider, for example), and then all other displays update automatically as desired. This result may be achieved by moving the hydraulic simulation to a separate thread of execution, which allows the user to continue to use the GUI. As the simulation progresses, results are displayed "as they become available" to allow the users to see results (e.g., volume changes) immediately after they make a change. The results that depend on the hydraulic simulation may "fill in as they are available". Additional features that may be provided include the ability to capture "snapshots" of interesting time & depth combinations, add them to a table, comment them, and click on them to reproduce them on the charts.

The displays of FIGS. 4.1-4.8 may be used to display data as it is monitored (as in FIG. 2.1), and to perform real-time simulations based on such monitored data (as in FIG. 2.2). The real-time monitoring displays may be considered by the user to determine if an adjustment may be made. For example, while pre-operational simulation 235.1 may show that the pumping falls within the upper and lower limits 353.1, 353.2 as shown in FIG. 4.8, data simulated in real-time to generate the simulation 235.2 shows that the actual results fall outside the upper and lower limits 353.1, 353.2. In such a case, alarms may activate to alert users to make a manual change (e.g., to adjust pumping for the rig and/or cement pump) and/or automatic adjustments may be activated (e.g., by the processor/controller).

The displays of FIGS. 4.1-4.8 may be used for job monitoring involving, for example, input and output flow-rate measurements. To achieve optimum quality control of a primary cement job, measured annular return rates may be compared with simulated data. Using the displays, these comparisons may be monitored by users in real-time. Return rates and wellhead pressures may provide a job signature usable for understanding behavior and discrepancies between simulated and measured cementing parameters. These displays may be used, for example, to enhance accuracy needed to properly assess risks of job issues, such as channeling and mixing, unsuspected washout, lost circulation, flow restriction, among others.

During pumping, certain fluid losses may be experienced as fluid is pumped into the wellbore. As a result, less fluid may flow out of the wellbore during this pumping. Potential divergence in volumes between volumes pumped into the wellbore versus volumes flowing out of the wellbore may indicate volume lost downhole. Such fluid losses may be reported by operators (e.g., cementers, drillers, mud loggers, and/or other users). FIGS. 4.9-4.17 show example additional outputs relating to mud system volumes, return flow rates, losses and loss simulations usable on the dashboards of FIG. 3.

FIG. 4.9 shows an output 340.9 selectable using function 342. The output 340.9 displays a comparison of the actual amount of mud in the mud system (active tank total vol) and the simulated amount of mud in the mud system [sim]. The graph 355.1 plots the amount of mud as measured in total volume, and the amount of mud as simulated in total volume over time. The graph 355.2 plots the amount of mud as measured in change in active volume, and the amount of mud as simulated change in active volume. These plots in FIG. 4.9 may indicate that losses are occurring and the effect of the losses on the volume of mud in the active system.

A button 359 on the bottom right is shown to provide users a way to define which mud tanks are part of the active system that receive returns during the job. Clicking on this button 359 opens the display shown in FIG. 4.10 where the user can see the volumes of mud in the various tanks and select the tanks that comprise the active system.

FIG. 4.10 shows an output 340.10 which displays each of the channels 357 for each of the sensors measuring parameters at the wellsite (see, e.g., FIG. 2.2). FIG. 4.10 shows the sensor data from individual channels 357 correlating to individual tanks (1-10) in the cementing system for the channels selected by the user for viewing. This output 340.10 has a graph depicting volume over time for each of the channels the user selected to define part of the active system.

Return flow rate is a fundamental quantity that may be used to assess and/or simulate fluid losses that may occur during pumping. FIGS. 4.11-4.14 are displays which may be used by the user to determine the rate of fluids flowing out of the annulus during pumping at the wellsite. Fluid return rate may be measured using various devices, such as a return flow meter or a return paddle flow meter, and/or computed from active tanks volume change as described below. FIG. 4.11 shows return rate measured using a return flow meter. FIGS. 4.12-4.13 show return rate measured using a return paddle flow meter. FIG. 4.14 shows return rate computed from active tanks volume change. Each device is considered herein.

FIG. 4.11 shows a first example depicting the return rate determined using a return flow meter (selected by configuration option 363.1). Return flow meters may be of various types including, but not limited to, Coriolis, electromagnetic, and FLAG (Fluid Loss and Gain Detection) such as one commercially available from GEOSERVICES™, a SCHLUMBERGER TECHNOLOGY CORPORATION™ company, at www.slb.com.

FIG. 4.11 includes graphs 360.1 and 360.2 depicting flow rate measured by all selected sources and the flow meter, respectively. Graph 360.1 shows a comparison plot of return rates from all of the return flow devices that are configured. In this case, only the return flow meter device is configured, so only the return flow meter return flow parameters are shown on the graph, but additional devices may optionally be shown as described further herein. Graph 360.2 plots data specific to the selected return rate data source (in this case the return flow meter). This graph shows, for example, bypass flow rate that might be subtracted from the return flow meter rate to determine the actual flow rate out of the annulus. Configuration details for the selected return rate data source (in this case the return flow meter) may be set by using the configure button 363.4 as described further below.

FIGS. 4.12-4.13 show a second example output 340.12 depicting the return rate determined using a return paddle flow meter (selected by configuration option 363.2. Examples of return paddle flow meters that may be used are commercially available from SIGNET™ at www.signetinstrumentation.com. The return paddle meter (or deflectional paddle-type meter) in the drilling rig return line may indicate an amount of cross sectional area of a pipe having a cross sectional area of a fluid in partially filled pipe as a function of the pipe geometry, fluid properties and flowrate.

Graph 360.1' in FIG. 4.12 shows a comparison plot of return rates from all of the return flow devices that are configured. In this case, both a return flow meter and return paddle meter are configured. Graph 360.2' plots data specific to the selected return rate data source (in this case the return paddle meter).

FIG. 4.13 displays output 340.13 depicting the configuration details available when using the configure button 363.4. Graph 362.1 shows a real time display of various measured quantities. Graph 362.2 shows the calibration curve fit to calibration points shown in table 362.3 using, for example, a linear interpolation or quadratic regression. The calibration points may be gathered, for example, by plotting the Cement Rate, Rig Rate and By Pass Rate with the Paddle Meter measurements to help in the selection of sample points. Once completed, curves of the measured return flow meter may be generated as shown by the graphs 360.1', 360.2' of FIG. 4.12.

FIG. 4.14 shows a third example display 340.14 depicting the return rate computed from the active tanks total volume selected by configuration button 363.3. The return rate may be, for example, the slope of a line determined using a least squares best fit of the measured tank total volume (see, e.g., graph 355.1 of FIG. 4.9) acquired from tank level sensors (see, e.g., channels selected in FIG. 4.10).

Graph 360.1" shows a comparison plot of return rates from all of the return flow devices that are configured. In this case, all three types of return rate measurement devices are configured as shown in 360.1". Graph 360.2" plots data specific to the selected return rate data source (in this case active tanks volume change).

FIGS. 4.15-4.17 show various outputs 340.15-340.17 usable for visualizing and interpreting data and simulation results for cases where losses may occur. FIG. 4.15 depicts example of graphs which the user may select for display. In this example, graphs 368.1-368.3 are shown depicting surface pressure data, returns data, and losses data, respectively. In this case the user has selected a return rate data source option 369.1, but has not clicked button 369.2 so losses are not being considered in the real-time simulation.

FIGS. 4.16 and 4.17 show how losses can be included in the real-time simulation by first defining a loss zone in FIG. 4.16 using the configure button 369.2 and then enabling loss simulation using the check box 369.2 in FIG. 4.17. The display 340.16 shows graphs 368.1'-368.3' which depict the pressure, returns, and losses data.

Losses may be included by having the simulator (e.g., CEMCADE™, CEMENTICS™, etc.) determine a fluid loss rate for the loss zone such that the simulated return flow rate matches the measured return flow rate. FIG. 4.17 shows the "loss simulation" and the simulation rerun for the graphs of FIG. 4.16. The adjusted results are shown in adjusted graphs 368.1"-368.3" and output 340.6" of FIG. 4.17 adjusted for losses. Including losses in the simulation may result in better estimation of fluid interface positions (shown in 340.6'").

FIGS. 4.18-4.19 relate to managed pressure cementing. FIG. 4.18 is similar to FIG. 4.17, except that measured backpressure is applied as a boundary condition on the simulator. The display 340.18 shows graphs 368.1"'-368.3"' which depict the pressure, returns, and losses data and output 340.6"' as in FIG. 4.17 adjusted for backpressure. FIG. 4.19 includes a graph 372.1 showing backpressure and ED graphs 352.1', 352.2' similar to those of FIG. 4.8 modified for backpressure. Sliders 439.1, 439.2 may be used to vary the displays as described previously herein.

A measured backpressure may be used in place of atmospheric pressure in the managed pressure cementing to determine downhole conditions. Managed pressure cementing allows users to control the downhole pressure, to be between the fracture and pore pressure. Managed pressure cementing provides a solution for challenging formations (i.e. over pressured zones) that cause pore and fracture pressure to be close. The managed pressure cementing process may be intended to avoid continuous influx of formation fluids to surface that can jeopardize the well integrity.

Integrated Cementing Operations

Calculations may be performed to determine whether the cement is properly positioned about the casing and/or the wellbore, and/or is properly isolating the wellbore. These calculations may be applied to define operating limits, such as the limits 353.1, 353.2 of FIG. 4.8. These limits may be applied at various pumping sequences to define operational constraints throughout the cementing operation. Simulations may be performed to iterate various possibilities and define optimal operating parameters for various constraints. Various operational limits may be added to the displays 340.1-340.19. For example, simulations based on the solution of the Navier-Stokes Equations (1)-(3) may be performed to compute various quantities and compare values to real time measurements.

Additional simulations may be performed to consider backpressure and/or to manage pressure during cementing operations.

Figure 5:
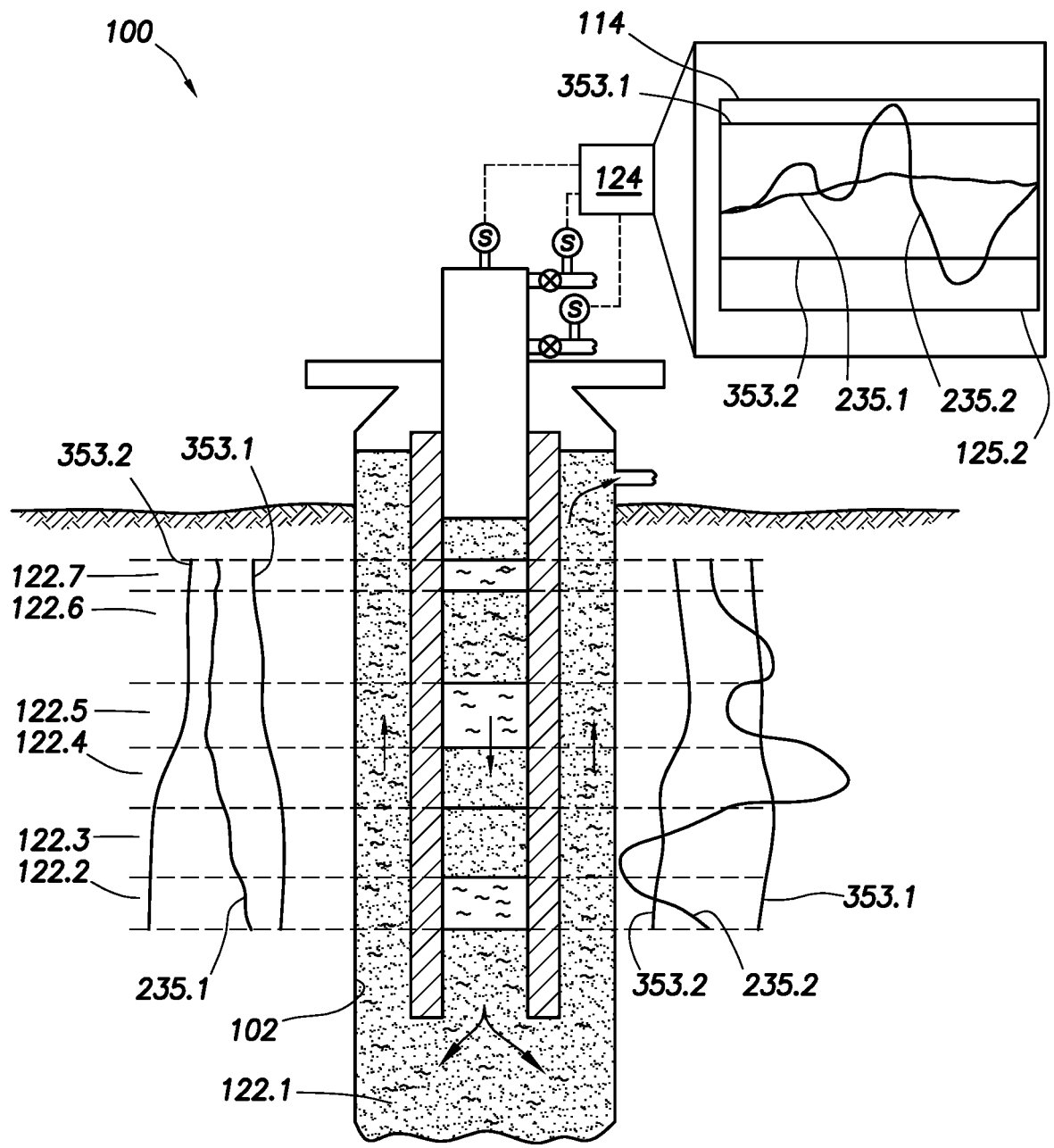
FIG. 5 is a schematic illustration of a portion of the wellsite depicting predicted and real-time simulation for multiple pumping sequences of the cementing operation.

FIG. 5 shows another view of the wellsite 100 depicting simulations relating to the cementing operations at the wellsite 100. As shown in this view, simulations may be performed by the cementing component 114 before and/or during cementing. Pre-operation and real-time simulations 235.1, 235.2 may be displayed on the display 125.2 for comparison. The pre-operation simulation 235.1 is schematically shown to the left of the wellbore 102. Real-time simulation 235.2 is schematically shown to the right of the wellbore 102. The simulations 235.1, 235.2 are depicted along the wellbore 102 corresponding to the pumping sequences 122.1-122.7.

Various calculations may be performed to predict cementing operations before any activity occurs at the wellsite as shown, for example, in FIG. 2.1. Known and/or predicted wellsite parameters may be input into conventional simulators to predict the cementing parameters. Simulations may be performed using, for example, simulation software, such as CEMCADE™ and CEMENTICS™ commercially available from SCHLUMBERGER TECHNOLOGY CORPORATION™ at www.slb.com. Outputs from the simulations may be used to design the cementing operations. These outputs may define, for example, the number and duration of the pumping sequences and corresponding pumping parameters, such as pressures, volumes, flow rates, etc. The outputs may include, for example, the example outputs of FIGS. 4.1-4.19.

As also schematically shown by FIG. 5, the pre-operation simulation 235.1 based on the wellsite data provided before cement is passed into the wellbore 102 indicates that the pumping sequences as designed maintain the cementing parameters within the predetermined wellbore limits 353.1, 353.2. These simulations performed based on the preliminary information suggest that the cement design maintains the cementing at levels that prevents fluid invasion and fracturing.

The real-time simulations 235.2 may be performed in real-time by performing the simulation as measurements are taken at the wellsite as shown, for example, in FIG. 2.2. The sensors at the wellsite may be coupled to the cementing component to receive and process the measurements (see, e.g., FIG. 2.2). The measurements may be fed into the simulator (e.g., CEMCADE™, CEMENTICS™, etc.) as the measurements are received to generate new simulations. New simulations may be performed continuously in real-time to continuously refine the real-time cementing parameters. These real-time simulations 235.2 (and/or other data) may be displayed against the pre-operation simulations 235.1 for comparison (and/or validation, confirmation, analysis, etc.) as shown by display 125.2 generated via surface unit 124. Adjustments may be made to the cementing operation (e.g., adjusting flow) based on such simulations.

As also schematically shown by FIG. 5, the real-time simulation 235.2 generated based on the real-time wellsite measurements indicates that the pumping sequences as designed fail to maintain cementing parameters within the predetermined wellbore limits 353.1, 353.2. The real-time simulation 235.2 shows that the designed pumping sequences would result in out of range conditions, including fluid invasion at pumping sequences 122.4, 122.5 and fracturing at pumping sequences 122.2/122.3. This indicates that the designed pumping sequences may require adjustment to maintain the cementing within the limits 353.1, 353.2. Out of range conditions may be detected based on simulations of flow (e.g., FIGS. 4.1-4.8), comparisons of flow measurements devices (e.g., FIGS. 4.11-4.13), and/or simulations with backpressure (e.g., FIGS. 4.19), among others.

To prevent the cementing operation from exceeding the limits, adjustments may be made by the users during the cementing. For example, the pumping parameters, such as density, flow rate, pressure, etc., may be adjusted to remain within the limits 353.1, 353.2. As shown by FIG. 5, the adjustments may be made in real-time to vary flow as the pumping sequences 122.1-122.7 progress into the wellbore 102, thereby providing a means for assuring proper cementing as the cement and fluids are pumped into the wellbore 102.

During simulation, it may be useful to determine when a pumping sequence begins during the cementing operation. The various pumping sequences may be detected by monitoring the pumping parameters during the pumping of the fluid and/or cement and/or examining the pumping sequences defined by the job schedule as shown in FIGS. 4.1 and 4.2. If the design schedule is maintained over volume, identification of the pumping sequences may be determined. This identification may be determined, for example, by integrating the flow rate measurement and comparing it with the job schedule. However, if the design schedule is violated, identification of the pumping sequences may involve further analysis. Identification in either case may be determined using, for example, an automatic pumping sequence change detector.

A cementing job may ordinarily be executed according to the predefined pumping job schedule (see, e.g., FIG. 4.1). This job schedule may include the pumping sequences 122.1-122.7 and the fluid volumes and pauses organized by pumping order. Each pumping sequence may have its own ID (sequence number), fluid type, planned density, planned rate and planned volume. The fluid pumping sequences may (or may not) be separated by spacers (pauses). Each pumping sequence may have either "completed", "started" or "not started" status. The goal of pumping sequence change detector may be to identify a status of the pumping sequences from data (e.g., flow rate, density, volume, and/or pressure) acquired during cementing in real-time. This data may take into account variability in those measurements.

The simulations may involve collecting cementing data, performing automatic pumping sequence identification (ID), feeding the data and pumping sequence ID into the simulator with other data in real-time. Simulations may be performed in real-time as measurements taken during the pumping sequences are passed to the simulator. The simulation may involve a cumulative volume calculation.

The simulation may include assumptions, such as the following: volume is the primary variable to raise a pumping sequence change; an engine is used for segmentation of rate; changes in pumping sequence pumping rates can be used to differentiate one pumping sequence from another one; density can be used to differentiate one pumping sequence from another one in case one fluid pumping sequence follows another fluid pumping sequence with a difference in density; average density values may be calculated based on segments provided by segmentation of rate; the user may select where to use rate or/and density in addition to volume before the calculation starts using "feature manager"; "feature manager" may be pre-populated from the schedule; volume may be selected by default; rate and density may be selected automatically if the schedule indicates changes in such items from pumping sequence to pumping sequence; if not, the volume may be used alone and pressure channel may not be used for pumping sequence change detection. Changes in density (either mixing or downhole) and flow rate may be used in addition to the cumulative volume to infer pumping sequence changes. The data may be passed to the hydraulic simulator.

Pre-operation (pre-job) drilling fluid circulation may be used to determine if hole properties and drilling fluid parameters are accurate. Real-time monitoring of surface pressures and rates in/out may be used to adjust open hole volume (annular excess), adjust flow rates in case of higher than expected circulating pressures, update expected fracture gradient, and/or using surface pressure, pump rate, return rates, fluid densities, etc.

Examples of changes that may be made by the users may include: in pump-rate (e.g., to keep ECD's below fracture gradients), circulate out (if cement QA is outside specifications), casing movement (start or stop casing reciprocation/rotation based on fluid location using RT simulation, formation pack-off, etc.), casing pumped out of hole based on simulated vs. actual hookload, and real-time optimization of under-displacement values for plug cement jobs based on actual acquired volume and density pumped.

Quality assurance/quality control (QA/QC) may be used to determine if improper fluid was pumped based on matching the fluid density to the design file (example: wrong pit was lined up). A warning (or alarm) may be issued if mixing density or QA/QC of solid fraction monitor to determine is outside specification. Real-time fluid injection and return temperature information may be used to determine wellbore temperature profile and adjust (temperature-dependent) fluid properties (compressibility/density/rheology) input into hydraulic simulator.

Figure 6:
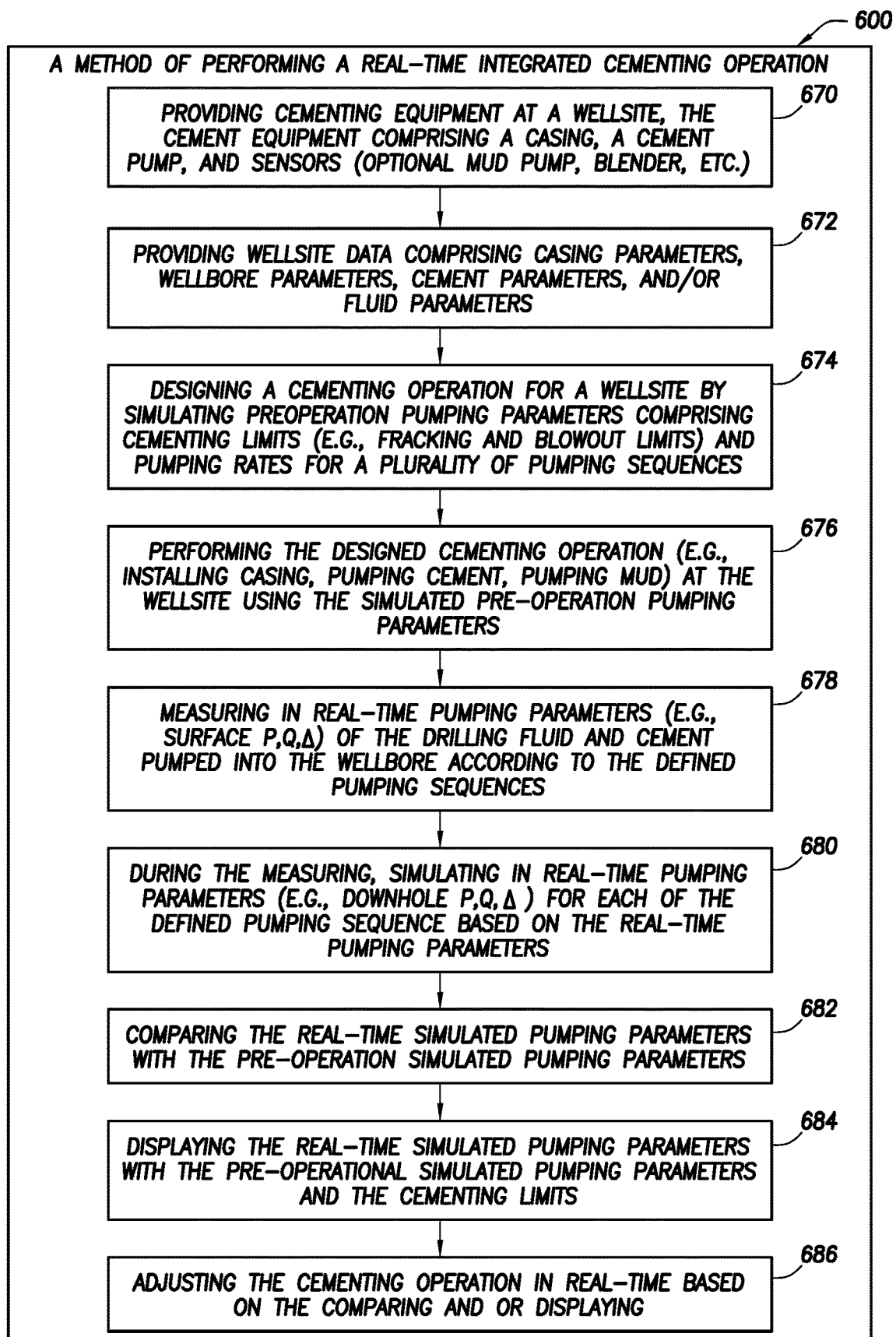
FIG. 6 is a flow chart depicting a method of performing a real-time integrated cementing operation.

FIG. 6 is a flow chart depicting a method 600 of performing a real-time integrated cementing operation. The method involves 670—providing cementing equipment at a wellsite. The cement equipment comprises a casing, a cement pump, and sensors (optional drilling fluid pump, blender, etc.) The cement equipment may also include a surface unit and/or a cementing component.

The method continues with 672—providing wellsite data comprising casing parameters, wellbore parameters, cement parameters, and/or fluid parameters, 674—designing a cementing operation for a wellsite by simulating pre-operation pumping parameters comprising cementing limits (e.g., fracking and blowout limits) and pumping rates for a plurality of pumping sequences, 676—performing the designed cementing operation (e.g., installing casing, pumping cement, pumping mud) at the wellsite using the simulated pre-operation pumping parameters, 678—measuring real-time pumping parameters (e.g., surface p, q, δ) of the drilling fluid and cement pumped into the wellbore according to the defined pumping sequences, 680—during the measuring, simulating real-time pumping parameters (e.g., downhole p, q, δ) for each of the defined pumping sequence based on the real-time pumping parameters, 682—comparing the real-time simulated pumping parameters with the pre-operation simulated pumping parameters, 684—displaying the real-time simulated pumping parameters with the pre-operational simulated pumping parameters and the cementing limits, and 686—adjusting the cementing operation in real-time based on the comparing and/or displaying.

The method may also involve pumping fluid into the wellbore at an input flow rate, measuring a return flow rate of the fluid as the fluid flows out of the wellbore, generating a rate of fluid loss from the input flow rate and the measured return flow rate, defining a loss zone within the wellbore (the loss zone having an upper zone limit and a lower zone limit), simulating the return flow rate based on the input flow rate, and/or generating a rate of the fluid loss from the loss zone such that the simulated return flow rate equals the actual return flow rate.

Part or all of the methods provided herein may be performed in any order and repeated as desired.

Although the present disclosure has been described with reference to certain embodiments and implementations thereof, the present disclosure is not to be limited by or to such embodiments and/or implementations. Rather, the systems and methods of the present disclosure are susceptible to various modifications, variations and/or enhancements without departing from the spirit or scope of the present disclosure. Accordingly, the present disclosure expressly encompasses all such modifications, variations and enhancements within its scope.

It should be noted that in the development of any such actual embodiment, or numerous implementation, specific decisions may be made to achieve the developer's specific goals, such as compliance with system related and business related constraints, which will vary from one implementation to another. Moreover, it will be appreciated that such a development effort might be complex and time consuming but would nevertheless be a routine undertaking for those of ordinary skill in the art having the benefit of this disclosure. In addition, the embodiments used/disclosed herein can also include some components other than those cited.

In the description, each numerical value should be read once as modified by the term "about" (unless already expressly so modified), and then read again as not so modified unless otherwise indicated in context. Also, in the description, it should be understood that any range listed or described as being useful, suitable, or the like, is intended that any and every value within the range, including the end points, is to be considered as having been stated. For example, "a range of from 1 to 10" is to be read as indicating each and every possible number along the continuum between about 1 and about 10. Thus, even if specific data points within the range, or even no data points within the range, are explicitly identified or refer to a few specific ones, it is to be understood that inventors appreciate and understand that any and all data points within the range are to be considered to have been specified, and that inventors possessed knowledge of the entire range and all points within the range.

The statements made herein merely provide information related to the present disclosure and may not constitute prior art, and may describe some embodiments illustrating the invention. All references cited herein are incorporated by reference into the current application in their entirety.

Although a few example embodiments have been described in detail above, those skilled in the art will readily appreciate that many modifications are possible in the example embodiments without materially departing from the system and method for performing cement operations. Accordingly, all such modifications are intended to be included within the scope of this disclosure as defined in the following claims. In the claims, means-plus-function clauses are intended to cover the structures described herein as performing the recited function and not just structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

What is claimed is:

1. A cementing system, comprising:
   a rig pump for passing drilling fluid, water, and displacement fluid to a wellbore, via a first flowline connecting the rig pump to a wellhead of the wellbore, according to a well plan;
   a cement pump for passing first and second cement slurries to the wellbore via a second flowline connecting the cement pump to the wellhead;
   first and second densitometers, first and second flow meters, and first and second pressure gauges for measuring respective densities, flow rates, and pressures of fluids in the respective first and second flowlines;
   a third densitometer and a third flow meter for measuring a respective density and flow rate of a fluid in a return flowline receiving fluid from the wellbore;
   a cementing component comprising a processor operable with a surface operating device to perform pumping sequences according to a cementing program of the well plan, wherein:
      the cementing component graphically displays in real-time the densities, the flow rates, and the pressures measured by each of the densitometers, the flow meters, and the pressure gauges;
      the cementing program is at least partially based on pre-simulations performed prior to performing the cementing program, wherein the pre-simulations are based on geometry of the wellbore, properties of the drilling fluid, the water, the displacement fluid, the first and second cement slurries, and equipment data, wherein the equipment data comprises dimensions, specifications, client data, and measurements; and the cementing component performs real-time hydraulic simulations using real-time densities, flow rates, and pressures measured by each of the densitometers, the flow meters, and the pressure gauges, and wherein the cementing component comprises a wellbore schematic display graphically depicting, in real-time:

the first flowline connecting the rig pump to the wellhead;

the second flowline connecting the cement pump to the wellhead;

the pumping sequences according to the cementing program of the well plan;

estimated fluid interface positions in the wellbore;

with respect to fluid previously and currently being pumped into the wellbore:

results of the pre-simulations for one or more of the measured fluid densities, flow rates, and pressures;

results of the real-time simulations for one or more of the measured fluid densities, flow rates, and pressures; and predetermined wellbore limits for the displayed one or more of the measured fluid densities, flow rates, and pressures; and a time slider configured to allow users to go back and see where fluids were positioned in the wellbore at any previous time, wherein by moving the time slider back and forth, a specific time during the cementing program may be selected to see corresponding measurements at that specific time, wherein the graphical depiction of the first flowline and the second flowline is shown on the wellbore schematic display positioned above the graphical depiction of the estimated fluid interface positions in the wellbore, and wherein the graphical depiction of the estimated fluid interface positions in the wellbore is shown on the wellbore schematic display positioned above the graphical depiction of the time slider.

2. The cementing system of claim 1 wherein the pumping sequences of the cementing program include:

pumping the drilling fluid into the wellbore via the rig pump and the first flowline;

after pumping the drilling fluid, pumping the water into the wellbore via the rig pump and the first flowline;

after pumping the water, pumping the first cement slurry into the wellbore via the cement pump and the second flowline;

after pumping the first cement slurry, pumping the second cement slurry into the wellbore via the cement pump and the second flowline;

after pumping the second cement slurry, pumping additional water into the wellbore via the rig pump and the first flowline; and after pumping the additional water, pumping the displacement fluid into the wellbore via the rig pump and the first flowline.

3. The cementing system of claim 1 wherein the real-time hydraulic simulations include performing calculations of conservation of mass, conservation of momentum, and conservation of energy.

4. The cementing system of claim 1 wherein the cementing component displays the real-time hydraulic simulations plotted with the real-time densities, flow rates, and pressures measured by each of the densitometers, the flow meters, and the pressure gauges.

5. The cementing system of claim 1 wherein the cementing component utilizes the real-time hydraulic simulations to determine performance indicators and displays the determined performance indicators.

6. The cementing system of claim 1 wherein the cementing component utilizes the real-time hydraulic simulations and the real-time densities, flow rates, and pressures measured by each of the densitometers, the flow meters, and the pressure gauges to assess cement quality.

7. The cementing system of claim 1 wherein the cementing component utilizes the real-time hydraulic simulations and the real-time densities, flow rates, and pressures measured by each of the densitometers, the flow meters, and the pressure gauges to detect fluid losses.

8. The cementing system of claim 1 wherein the cementing component advances the pumping sequences automatically by:

integrating flow rate during each pumping sequence over time to compute an actual volume pumped during each pumping sequence;

automatically advancing to a next pumping sequence when the computed pumping sequence volume reaches a planned pumping sequence volume; and identifying pauses during pumping and matching the identified pauses to a planned pumping pause.

9. The cementing system of claim 1 wherein the cementing component advances the pumping sequences automatically based on one or more of the measured fluid densities as an indicator of pumping sequence change boundaries.

10. The cementing system of claim 1 wherein:

the cementing component includes a job schedule display depicting a sequential list of the pumping sequences and corresponding time boundaries in tabular form; and the cementing component includes a stage adjustment display graphically depicting:

time logs of the real-time densities, flow rates, and pressures measured by each of the densitometers, the flow meters, and the pressure gauges; and vertical pumping sequence marker bars corresponding to each pumping sequence time boundary depicted in the job schedule display.

11. The cementing system of claim 10 wherein each pumping sequence marker bar is movable by a user via operation of a mouse or other input device to drag the pumping sequence marker bar and thereby change, in real time in both the stage adjustment display and the job schedule display, the corresponding time boundary for the associated pumping sequence.

12. The cementing system of claim 10 wherein:

the job schedule display permits a user to change one of the pumping sequences in real-time during performance of that pumping sequence and another one or more of the pumping sequences, including to:

adjust the time boundaries and other parameters of the pumping sequences; delete one or more of the pumping sequences; and add new pumping sequences; and such change by a user via the job schedule display automatically updates information depicted in the stage adjustment display.

13. The cementing system of claim 1 wherein the cementing component includes a job status summary display textually depicting in tabular form and in real-time:
  overall progress of the cementing program, including actual volume pumped and a percentage that the actual volume pumped is of a total planned volume to be pumped during the cementing program; and
  individual progress of each pumping sequence, including fluid identification for each pumping sequence, actual volume pumped during each pumping sequence, and a percentage that the actual volume pumped during each pumping sequence is of a total planned volume to be pumped during that pumping sequence;
  wherein a quantity of each percentage is also depicted by a corresponding color or shading.

14. The cementing system of claim 1 wherein the cementing component includes individual pumping sequence status displays each graphically and textually depicting in real-time, with respect to a corresponding one of the pumping sequences:
  pumping sequence identifier;
  fluid type;
  planned fluid volume;
  actual fluid volume;
  a percentage that the actual fluid volume is of the planned fluid volume;
  start time;
  elapsed time; and
  stop time.

15. The cementing system of claim 1 wherein the cementing component includes a real-time simulation comparison display that graphically depicts, with respect to time, a real-time hydraulic simulation results compared with the measured quantities for one or more of the density, flow rate, and pressure measurements.

16. The cementing system of claim 15 wherein the real time simulation comparison display includes a selection box by which a user can change the displayed comparison of one or more of the density, flow rate, and pressure measurements.

17. The cementing system of claim 1 wherein the cementing component includes a density control display depicting:
  a tabular summary of fluid parameters;
  a bar graph of volume percent by density; and
  a line graph or gauge of density by volume.

18. The cementing system of claim 1 wherein the cementing component includes a well security display graphically depicting, in real time:
  equivalent density of fluids in the wellbore as a function of time;
  equivalent density of fluids in the wellbore as a function of depth;
  an upper limit defining a level at which fracturing will occur and which is determined for each pumping sequence; and
  a lower limit defining a level at which fluid invasion into the wellbore will occur and which is determined for each pumping sequence.

19. The cementing system of claim 1 further comprising a drilling fluid system comprising the rig pump, the first flowline, the wellbore, the return flowline, a drilling fluid source, and other wellsite components intended to handle the drilling fluid, wherein the cementing component includes a drilling fluid comparison display graphically depicting a real-time comparison of an actual amount of drilling fluid in the drilling fluid system and the simulated amount of drilling fluid in the drilling fluid system output by the real-time hydraulic simulation, including a graph of an amount of drilling fluid measured as change in active volume versus and an amount of drilling fluid simulated as change in active volume, and wherein the graph indicates when losses are occurring and the effect of the losses on the volume of drilling fluid in the drilling fluid system.

* * * * *